(12) United States Patent
Sumida

(10) Patent No.: US 11,043,585 B2
(45) Date of Patent: Jun. 22, 2021

(54) SEMICONDUCTOR DEVICE AND METHOD OF MANUFACTURING THE SAME

(71) Applicant: RENESAS ELECTRONICS CORPORATION, Tokyo (JP)

(72) Inventor: Wataru Sumida, Ibaraki (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/374,283

(22) Filed: Apr. 3, 2019

(65) Prior Publication Data
US 2019/0326433 A1 Oct. 24, 2019

(30) Foreign Application Priority Data

Apr. 19, 2018 (JP) .............................. JP2018-080651

(51) Int. Cl.
*H01L 29/78* (2006.01)
*H01L 29/423* (2006.01)
*H01L 29/66* (2006.01)

(52) U.S. Cl.
CPC ...... *H01L 29/7813* (2013.01); *H01L 29/4236* (2013.01); *H01L 29/42368* (2013.01); *H01L 29/66727* (2013.01); *H01L 29/66734* (2013.01)

(58) Field of Classification Search
CPC ............ H01L 29/7813; H01L 29/4236; H01L 29/42368; H01L 29/66727; H01L 29/66734
See application file for complete search history.

(56) References Cited

U.S. PATENT DOCUMENTS

| 8,222,109 | B2 | 7/2012 | Yamamoto et al. |
| 9,196,720 | B2 | 11/2015 | Tokuda |
| 9,614,106 | B2* | 4/2017 | Yoshida .............. H01L 29/0834 |
| 2013/0075810 | A1* | 3/2013 | Hsieh .................. H01L 29/7811 257/328 |

FOREIGN PATENT DOCUMENTS

| JP | 2010-258252 A | 11/2010 |
| JP | 2014-150148 A | 8/2014 |

* cited by examiner

*Primary Examiner* — Fernando L Toledo
*Assistant Examiner* — Valerie N Newton
(74) *Attorney, Agent, or Firm* — McDermott Will & Emery LLP

(57) ABSTRACT

Reliability of a semiconductor device is improved. The semiconductor device including a first MISFET group of a plurality of first MISFETs and a second MISFET group of a plurality of second MISFETs has a plurality of trenches each formed in a semiconductor layer and formed of an upper trench part and a lower trench part, and a plurality of gate electrodes formed inside the plurality of trenches. A thinner gate insulator is formed to the upper trench part and a thicker field insulator is formed to the lower trench part. In a trench at the outermost position in the first MISFET group and a trench at the outermost position in the second MISFET group, the gate insulator is not formed in the upper trench part, but the field insulator is formed in the upper trench part and the lower trench part.

7 Claims, 21 Drawing Sheets

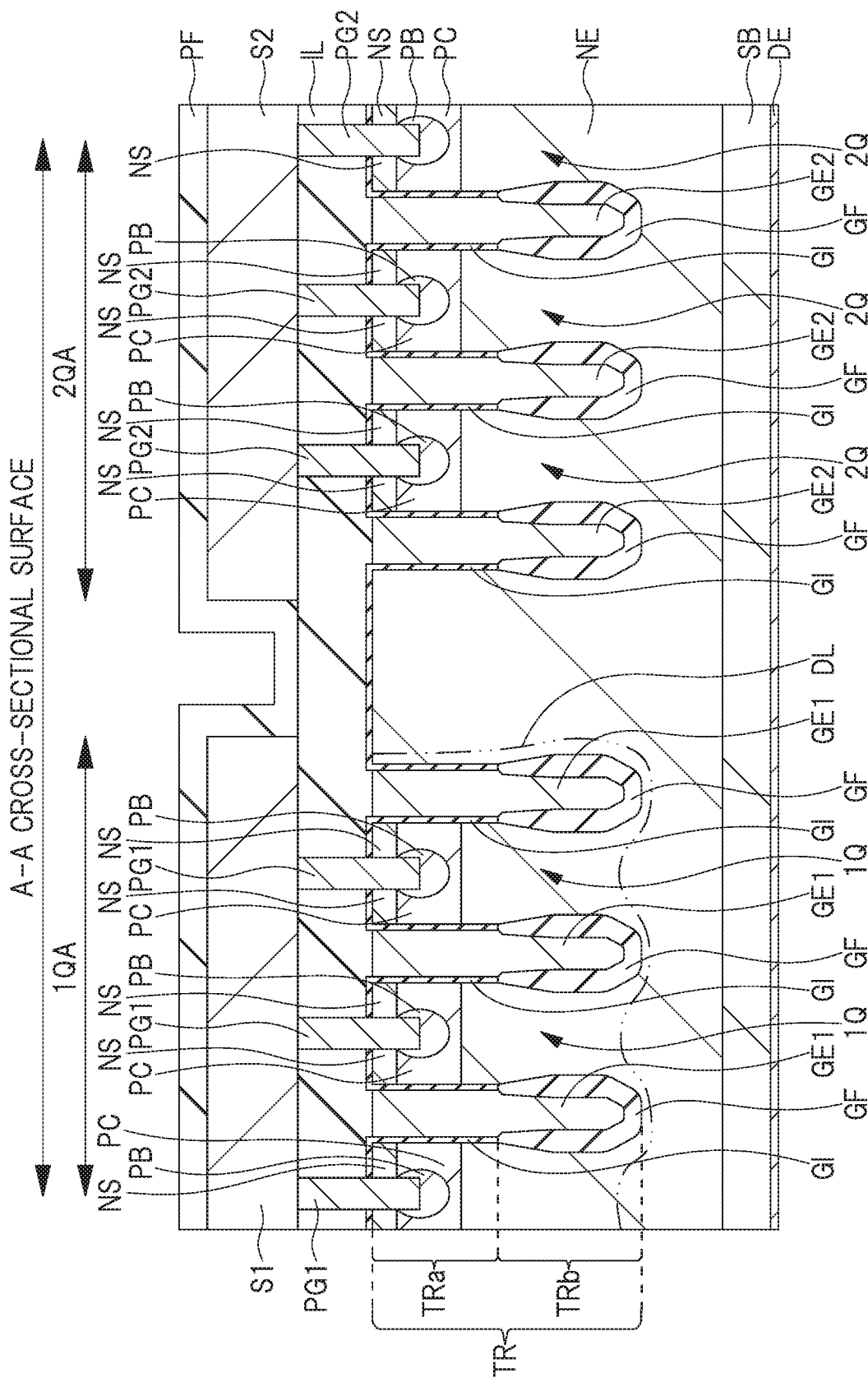

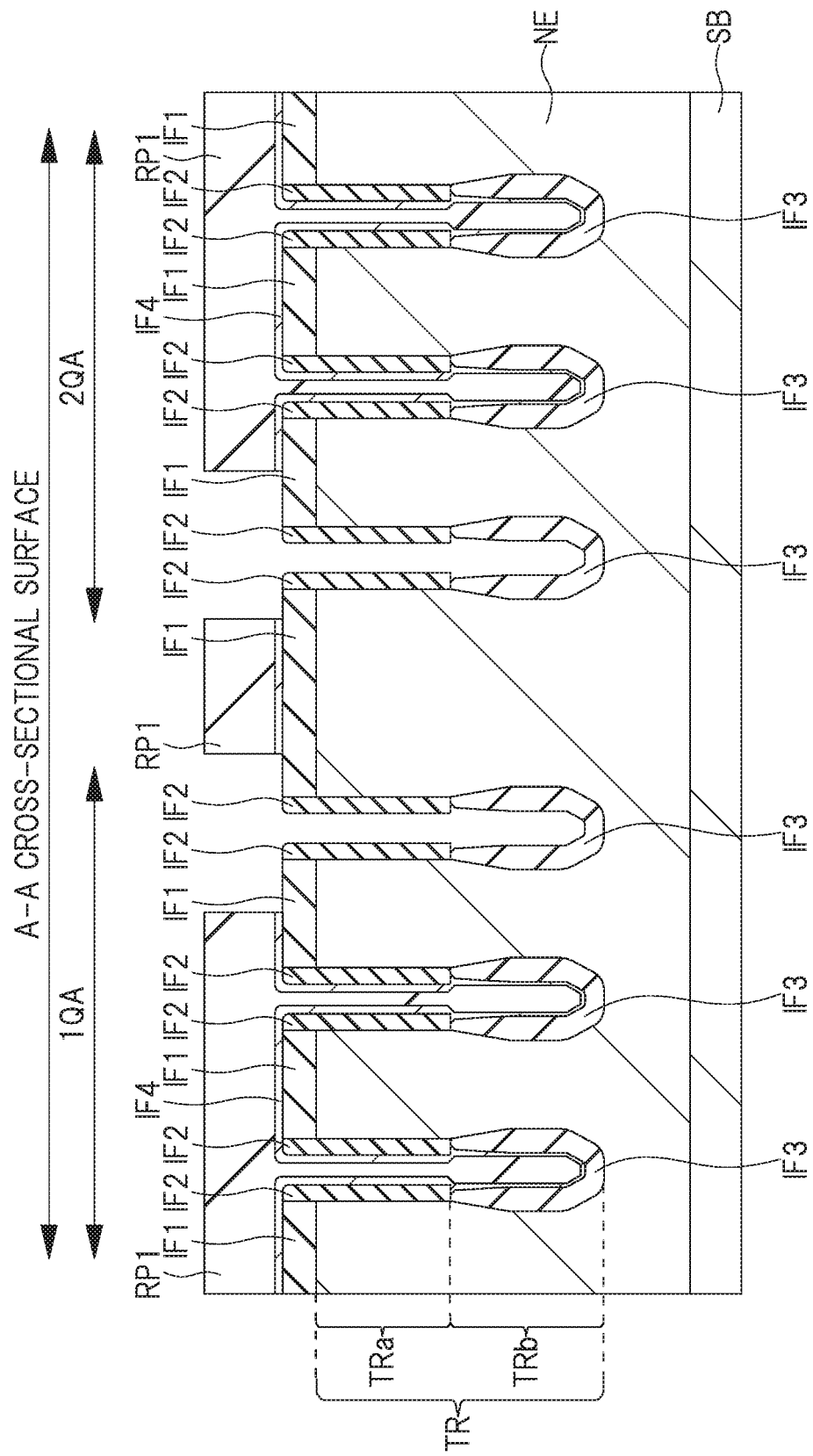

US 11,043,585 B2

SEMICONDUCTOR DEVICE AND METHOD OF MANUFACTURING THE SAME

CROSS-REFERENCE TO RELATED APPLICATION

The present application claims priority from Japanese Patent Application No. 2018-80651 filed on Apr. 19, 2018, the content of which is hereby incorporated by reference into this application.

TECHNICAL FIELD OF THE INVENTION

The present invention relates to a semiconductor device and a method of manufacturing the semiconductor device. Particularly, the present embodiment can be suitably used in a semiconductor device using a trench gate structure.

BACKGROUND OF THE INVENTION

In a power transistor, a MISFET (metal insulator semiconductor field effect transistor) having a trench gate structure in which a trench is formed in a semiconductor substrate and agate electrode is buried in the trench is used.

Japanese Patent Application Laid-Open Publication No. 2010-258252 (Patent Document 1) discloses a MISFET having a trench gate structure. Patent document 1 discloses a technology to make a thickness of a gate insulator formed to a top part of a trench larger than that of an insulator formed to a bottom part of the trench.

Japanese Patent Application Laid-Open Publication No. 2014-150148 discloses a technology to form a thick insulator not only to a bottom part of a trench but also a top part of the trench in a termination trench formed at the outermost periphery.

SUMMARY OF THE INVENTION

Problems to be Solved by the Invention

For example, when using a MISFET having a trench gate structure as a bidirectional switch, a first MISFET and a second MISFET are formed in one semiconductor chip and they are coupled to separate source electrodes, respectively. Accordingly, when a potential is applied between the source electrodes, a potential difference occurs to one of an outermost trench of the first MISFET and an outermost trench of the second MISFET which are next to each other, resulting in breakdown of a gate insulator formed in the outermost trench.

The above and other object and novel characteristics of the present invention will be apparent from the description of the present specification and the accompanying drawings.

Means for Solving the Problems

The summary of the typical aspects of the inventions disclosed in the present application will be briefly described as follows.

A semiconductor device of an embodiment includes a first region in which a plurality of first MISFETs are formed and a second region in which a plurality of second MISFETs are formed. IN addition, the semiconductor device includes a semiconductor substrate, a semiconductor layer formed on the semiconductor substrate, a plurality of trenches formed in the semiconductor layer, and a plurality of gate electrodes formed inside the plurality of trenches. Here, each of the plurality of has a trench top and a trench bottom. Also, among the plurality of trenches in the first region, in each trench, a second insulator which has a thickness larger than that of the first insulator is formed to the trench top, and the first insulator is formed to the trench bottom.

Effects of the Invention

According to an embodiment, reliability of a semiconductor device can be improved.

BRIEF DESCRIPTIONS OF THE DRAWINGS

FIG. 21 is a cross-sectional view of a semiconductor device according to a first studied example; and FIG. 22 is a cross-sectional view illustrating a manufacturing process of a semiconductor device according to a second studied example.

DESCRIPTIONS OF THE PREFERRED EMBODIMENTS

Figure 1:
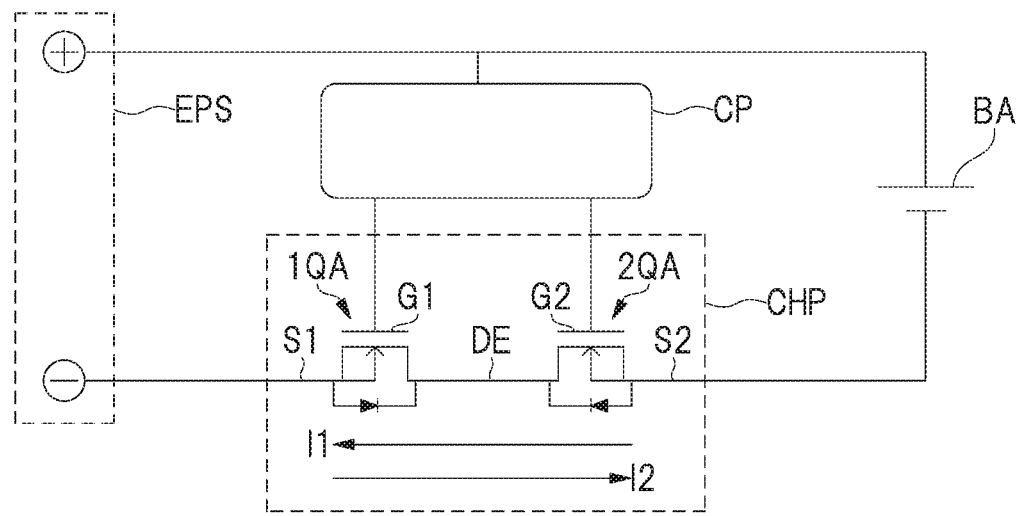
FIG. 1 is a diagram of a protection circuit in which a semiconductor chip that is a semiconductor device according to a first embodiment is used.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail on the basis of the accompanying drawings. Note that components having the same function are denoted by the same reference symbols throughout the drawings for describing the embodiment, and the repetitive description thereof will be omitted. And, in the following embodiments, the explanation for the same or similar portions are not repeated in principle unless otherwise particularly required.

In the cross-sectional view and the plan view, a size of each portion does not correspond to that of a practical device, and a specific portion is relatively illustrated to be large for easily understanding the drawing in some cases.

Further, in some drawings used in the embodiments, hatching is omitted in some cases so as to make the drawings easy to see.

First Embodiment

FIG. 1 illustrates a protection circuit of a secondary battery BA used in mobile devices etc. The secondary battery BA is, for example, a lithium ion battery. To the secondary battery BA, a semiconductor chip CHP that is a semiconductor device of a present embodiment and a control unit CP are coupled.

The semiconductor chip CHP includes a MISFET group 1QA and a MISFET group 2QA. The MISFET group 1QA and the MISFET group 2QA are coupled in series each other and each forming a part of a bidirectional switch. The MISFET group 1QA is formed of a plurality of n-type MISFETs 1Q which are coupled in parallel each other, and the MISFET group 2QA is formed of a plurality of n-type MISFETs 2Q coupled in parallel each other.

In the present embodiment, a phrase expressed as "gate, drain, or source of the MISFET group 1QA" means each gate electrode GE1, drain region NE, or source region NS of each of the plurality of n-type MISFETs 1Q. Such expressions are the same in the MISFET group 2QA.

The drain of the MISFET group 1QA and the drain of the MISFET group 2QA are coupled to each other by a common drain electrode DE. The source of the MISFET group 1QA is electrically couple to a negative (−) terminal of an external power source EPS of a protection circuit via a source wiring S1. The source of the MISFET group 2QA is electrically coupled to a negative electrode of a secondary battery BA via a source wiring S2. A positive electrode of the secondary battery BA is electrically coupled to a positive (+) terminal of the external power source EPS of the protection circuit. Gates of the MISFET group 1QA and the MISFET group 2QA are electrically coupled to a control unit CP via a gate wiring G1 and a gate wiring G2 respectively.

To charge the secondary battery BA in the protection circuit, first, the MISFET group 1QA and the MISFET group 2QA are turned on in the semiconductor chip CHP according to a signal from the control unit CP. Then, as illustrated in FIG. 1, as a current I1 is flowed in a direction from the MISFET group 2QA to the MISFET group 1QA, the secondary battery BA is charged. When the charging is finished, the MISFET group 1QA is controlled to be turned off. In this manner, the circuit is shut off so that excessive charging to the secondary battery BA is prevented.

In addition, to discharge the secondary battery BA in the protection circuit, as illustrated in FIG. 1, as a current I2 is flowed in a direction opposite to the charging (in a direction from the MISFET group 1QA to the MISFET group 2QA), the secondary battery is discharged. When the discharging is finished, the control unit CP detects the finish of discharging and controls the MISFET group 2QA to make it turned off. In this manner, the circuit is shut off so that excessive discharging of the secondary battery is prevented.

Figure 2:
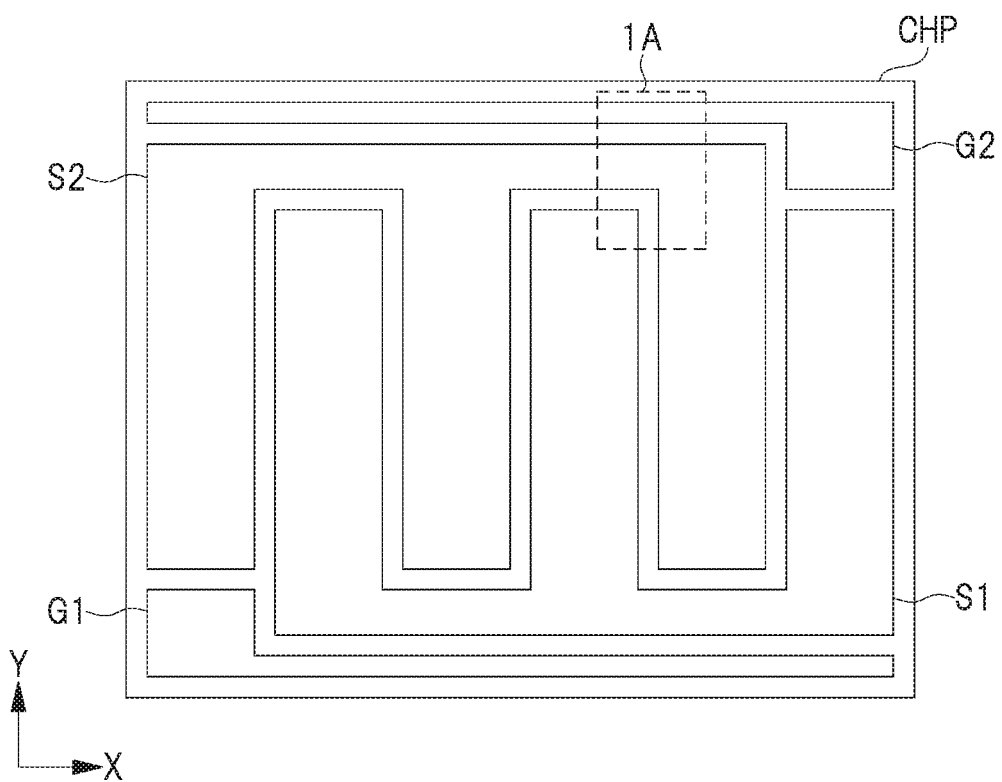
FIG. 2 is a planar layout diagram of the semiconductor chip that is the semiconductor device according to the first embodiment.

FIG. 2 is a planar layout diagram of the semiconductor chip CHP that is the semiconductor device of the present embodiment.

As illustrated in FIG. 2, most part of a surface side of the semiconductor chip CHP is covered by the gate wring G1, the gate wiring G2, the source wiring S1 and the source wiring S2. The gate wiring G1 and the gate wiring G2 extent in an X direction along an outer circumstance of the semiconductor chip CHP. The source wiring S1 and the source wiring S2 are formed in a comb-teeth like shape when viewed in a plan view and arranged so that the comb teeth are meshed with each other in a central part of the semiconductor chip CHP.

More specifically, planar shapes of the source wiring S1 and the source wiring S2 is a shape having a plurality of first parts extended in a Y direction and neighboring each other in the X direction and a second part extended in the X direction and coupled to the plurality of first parts. In the present embodiment, such a shape is called "comb-teeth shape" and a phrase expressed as "the comb teeth are meshed with each other" means that the first part of the source wiring S1 and the first part of the source wiring S2 are alternately arranged in the X direction.

In addition, although not illustrated in FIG. 2, to an upper surface of each of the gate wiring G1, the gate wiring G2, the source wiring S1, and the source wiring S2, a protection film PF is formed, and a plurality of opening portions are provided to a part of the protection film PF. Among the gate wiring G1, the gate wiring G2, the source wiring S1, and the source wiring S2, areas which are exposed from the opening portions are electrically coupled to a wiring board or another semiconductor chip via a wire bonding or an external connection terminal such as a copper plate (clip).

Figure 3:
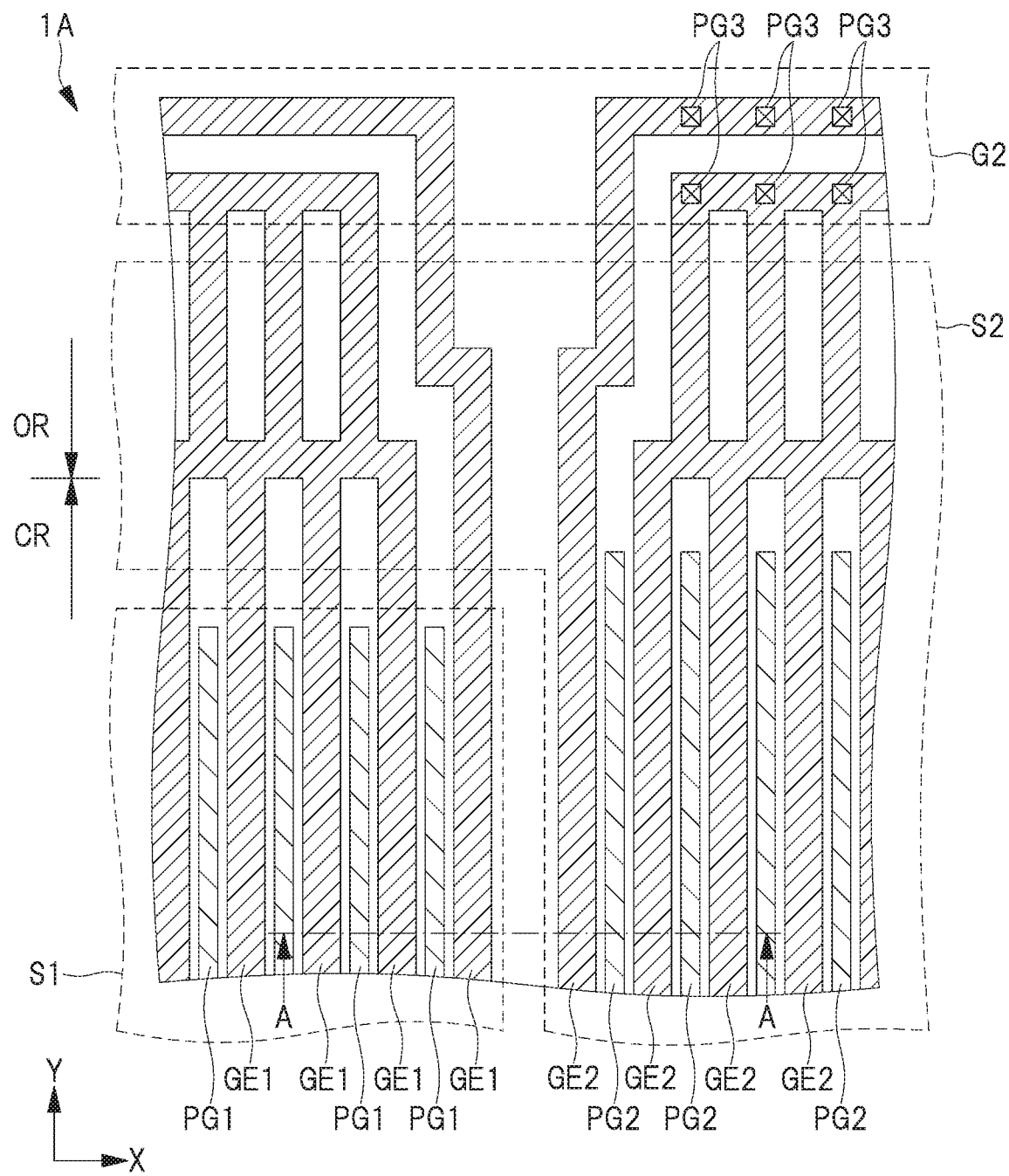
FIG. 3 is a plan view of a main part of the semiconductor device according to the first embodiment.

FIG. 3 is an enlarged diagram illustrating the area 1A indicated by a dotted line in FIG. 2 and is a plan view of a main part of the semiconductor chip CHP. Note that, although FIG. 3 is a plan view, to facilitate visualization of the diagram, hatching is added to the parts of the gate electrode GE1, the gate electrode GE2, and plugs PG1 to PG3. Also, to illustrate an arrangement relationship of the gate electrode GE1, the gate electrode GE2, and an upper layer of them, the gate wiring G2, the source wiring S1, and the source wiring S2 are illustrated by dotted lines.

An outer periphery region OR illustrated in FIG. 3 is a region mainly for the gate electrode GE2 to be coupled to the gate wiring G2. Above the gate electrode GE1 and the gate electrode GE2, the gate wiring G2 is formed. A cell region CR is mainly for the plurality of MISFETs 1Q and the plurality of MISFETs 2Q are actually operated as transistors. Below the source wiring S1 and the source wiring S2, the plurality of MISFETs 1Q and the present embodiment MISFETs 2Q are formed, respectively.

In the cell region CR, the plurality of gate electrodes GE1 and the plurality of gate electrodes GE2 are extended in the Y direction. Although not illustrated, between each of the gate electrodes GE1 and each of the gate electrodes GE2, the source region NS and so forth are formed, respectively. The source region NS of the MISFET 1Q is electrically coupled to the source wiring S1 via the plug PG1, and the source region NS of the MISFET 2Q is electrically coupled to the source wiring via the plug PG2.

In the outer periphery region OR, the gate electrode GE2 is electrically coupled to the gate wiring G2 via the plug PG3. Note that, although any illustration is omitted in the present embodiment, a lower part of the gate wiring G1 illustrated in FIG. 2 also has a layout that is like an inverse of FIG. 3, where the gate electrode GE1 is electrically coupled to the gate wiring G1 via another plug.

Figure 4:
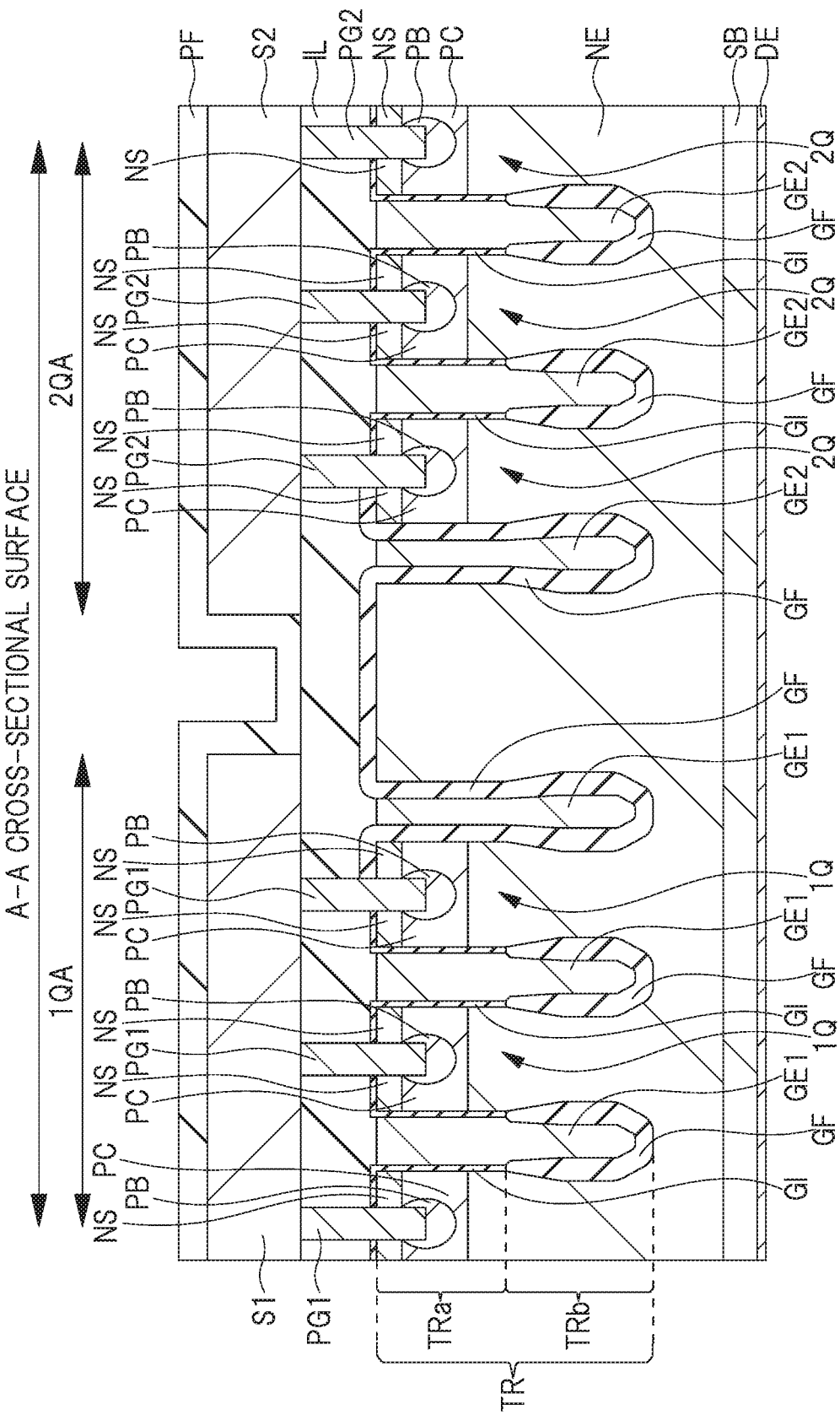
FIG. 4 is a cross-sectional view of the semiconductor device according to the first embodiment.

FIG. 4 is a cross-sectional view taken along a line A-A illustrated in FIG. 3. FIG. 4 illustrates, as a power transistor having a trench gate structure, the plurality of MISFETs 1Q composing the MISFET group 1QA and the plurality of MISFETs 2Q composing the MISFET group 2QA. In FIG. 4, a region to be the MISFET group 1QA and a region to be the MISFET group 2QA are also illustrated.

A semiconductor substrate SB used in the present embodiment is a silicon substrate in which an n-type impurity is injected. On an upper surface (first surface) of the semiconductor substrate SB, an n-type semiconductor layer NE is formed. On a back surface (second surface) of the semiconductor substrate SB, the drain electrode DE formed of a metal film is formed. The semiconductor substrate SB and the semiconductor layer NE each compose a part of a drain region of the power transistor and are electrically coupled to the drain electrode DE. As illustrated in FIG. 4, the drain electrode DE is used as a common electrode by the MISFET group 1QA and the MISFET group 2QA.

To a surface side of the semiconductor layer NE, a p-type channel region (impurity region) PC is formed. In the channel region PC, an n-type source region (impurity region) NS and a p-type body region (impurity region) PB are formed. The source region NS and the body region PB each are electrically coupled to the source electrode S1 or the source electrode S2 via the plug PG1 or the plug PG2 which will be described below. The body region PB is also a region provided to reduce a contact resistance upon coupling the plug PG1 or the plug PG2 to the channel region PC. Thus, an impurity concentration of the body region PB is higher than that of the channel region PC.

In addition, to the surface of the source region NS and the body region PB, a silicide layer may be formed in order to further reduce the contact resistance between them and the plug PG1 or the plug PG2. The silicide layer is formed of, for example, titanium silicide ($TiSi_2$), cobalt silicide ($CoSi_2$), or nickel silicide (NiSi). In the present embodiment, illustration of such a silicide layer is omitted.

In the semiconductor layer NE, a trench TR to be used for forming the gate electrode GE1 and the gate electrode GE2 is formed. The trench TR is formed so that it penetrates the source region NS and the channel region PC and reaches the semiconductor layer NE. That is, a bottom portion of the trench TR is positioned inside the semiconductor layer NE. Also, the trench TR is formed to be positioned between two source regions NS.

The trench TR is sectioned into an upper trench part TRa and a lower trench part TRb that is a region below the upper trench part TRa. The upper trench part TRa is contacted with the source region NS, the channel region PC, and the semiconductor layer NE and is a region in which the transistor is effectively operated.

To the upper trench part TRa, a gate insulator GI having a relatively small thickness is formed. To the lower trench part TRb, a field insulator GF having a relatively large thickness is formed. The gate insulator GI and the field insulator GF are, for example, a silicon oxide film. A thickness of the gate insulator GI is about 20 nm, for example. A thickness of the field insulator GF is about 100 nm, for example. In addition, in a lateral direction in FIG. 4 (X direction in FIG. 3), a width of the lower trench part is larger than that of the upper trench part TRa.

A part where the MISFET 1Q and the MISFET 2Q are actually operated as transistors is the upper trench part TRa to which the thinner gate insulator GI is formed. The lower trench part TRb to which the thicker field insulator GF is formed is provided for the purpose of electric-field mitigation.

A trench TR that is the closest to the MISFET 2Q among the trenches TR of the MISFET 1Q and a trench TR that is the closest to the MISFET 1Q among the trenches TR of the MISFET 2Q, the gate insulator GI is not formed to the upper trench part TRa but the field insulator GF is formed not only to the lower trench part TRb but also to the upper trench part TRa. In other words, in a trench TR at the outermost position of the MISFET group 1QA and a trench TR at the outermost position of the MISFET group 2QA, the field insulator GF is formed to the upper trench part TRa and the lower trench part TRb. Such a configuration is a main feature of the present embodiment and it will be described in more details below.

The gate electrode GE1 is buried inside of the trench TR of the MISFET group 1QA interposing the gate insulator GI or the field insulator GF. The gate electrode GE2 is buried inside the trench TR of the MISFET group 2QA interposing the gate insulator GI or the field insulator GF. The gate electrode GE1 and the gate electrode GE2 are, for example, a polycrystalline silicon film in which, for example, an n-type impurity is introduced.

On the source region NS, a part of the gate insulator GI or a part of the field insulator GF is formed. To each upper surface of a part of the gate insulator GI, a part of the field insulator GF, the gate electrode GE1, and the gate electrode GE2, an interlayer insulator IL formed of, for example, silicon oxide is formed. Then, in the interlayer insulator IL, a contact hole is formed. The contact hole is formed so as to penetrate the interlayer insulator IL and the gate insulator GI or the field insulator GF and to reach the source region NS and the body region PB. In the contact hole, a conductive film formed of, for example, tungsten is buried so that the plug PG1 and the plug PG2 are formed. Note that, although illustration is omitted here, the plug PG3 is also formed in the same configuration.

Note that a part of the gate insulator formed outside the trench TR and a part of the field insulator GF may be removed.

On the interlayer insulator IL, the source wiring S1 and the source wiring S2 are formed. The source wiring S1 is coupled to the plug PG1 and the source wiring S2 is coupled to the plug PG2.

To an upper surface of each of the source wiring S1 and the source wiring S2, a protection film OF formed of a resin such as polyimide or silicon nitride is formed. As described above, a plurality of opening portions are provided to a part of the protection film OF and the regions exposed from the opening portions are regions configured make coupling to an external connection terminal such as a wire bonding or a copper plate (clip).

Note that, in the present embodiment, while the wiring structure is of one layer, it may be two or more layers. For example, on a first wiring, an interlayer insulator and a plug may be further formed and the source wiring S1 and the source wiring S2 may be formed to the second wiring.

<Description of First Studied Example>

Prior to describing a feature of the present embodiment, with reference to FIG. 21, a semiconductor device of a first studied example which inventors of the present invention have studied will be described.

The semiconductor device of the first studied example has a plurality of MISFETs 1Q and a plurality of MISFETs 2Q of a trench gate structure. However, different from the semiconductor device of the present embodiment, in the semiconductor device of the first studied example, a gate insulator GI having a relatively small thickness is formed to an upper trench part TRa in a trench at an outermost position of an MISFET group 1QA and in a trench at an outermost position of an MISFET group 2QA.

Upon operating a bidirectional switch, among the MISFET group 1QA coupled to a source wiring S1 or the MISFET group 2QA coupled to a source wiring, a depletion layer is extended in one of the MISFET groups to which a higher electric potential is applied. In FIG. 21, in the MISFET group 1QA, a state in which a depletion layer DL illustrated by a two-dotted line is extended is illustrated. Here, as a high electric field is applied to the trench TR at the outermost position of the MISFET group 1QA at an end of the depletion layer DL, it is problematic that breakdown of the gate insulator GI having a smaller thickness occurs. Thus, there is a problem of reliability lowering of the semiconductor device of the first studied example.

<Main Feature of the Semiconductor Device of the Present Embodiment>

In the semiconductor device of the present embodiment, different from the first studied example described above, in the trench TR at the outermost position of the MISFET group 1QA and the trench TR at the outermost position of the MISFET group 2QA, the field insulator GF having a larger thickness is formed to the upper trench part TRa and the lower trench part TRb. In other words, in a trench TR closest to the MISFET 2Q among the trenches TR of the MISFET 1Q, and a trench TR closest to the MISFET 1Q among the trenches TR of the MISFET 2Q, the gate insulator GI having a smaller thickness is not formed to the upper trench portion TRa but the field insulator GF is formed to not only the lower trench part TRb but also the upper trench part TRa.

Thus, electric fields can be mitigated in the trench TR at the outermost position of the MISFET group 1QA and in the trench TR at the outermost position of the MISFET group 2QA. Thus, upon operating the bidirectional switch, even when any one of electric potentials of the source wiring S1 coupled to the MISFET group 1QA or the source wiring S2 coupled to the MISFET group 2QA becomes high, the problem of occurrence of breakdown of the gate insulator GI can be suppressed. In this manner, as compared to the first studied example, reliability of the semiconductor device can be improved.

<Manufacturing Method of the Semiconductor Device>

In the following, with reference to FIGS. 5 to 18, a method of manufacturing the semiconductor device according to the present embodiment will be described. Also, in FIGS. 5 to 18, in the same manner as FIG. 4, a cross-sectional view along the line A-A in FIG. 3 is illustrated.

Figure 5:
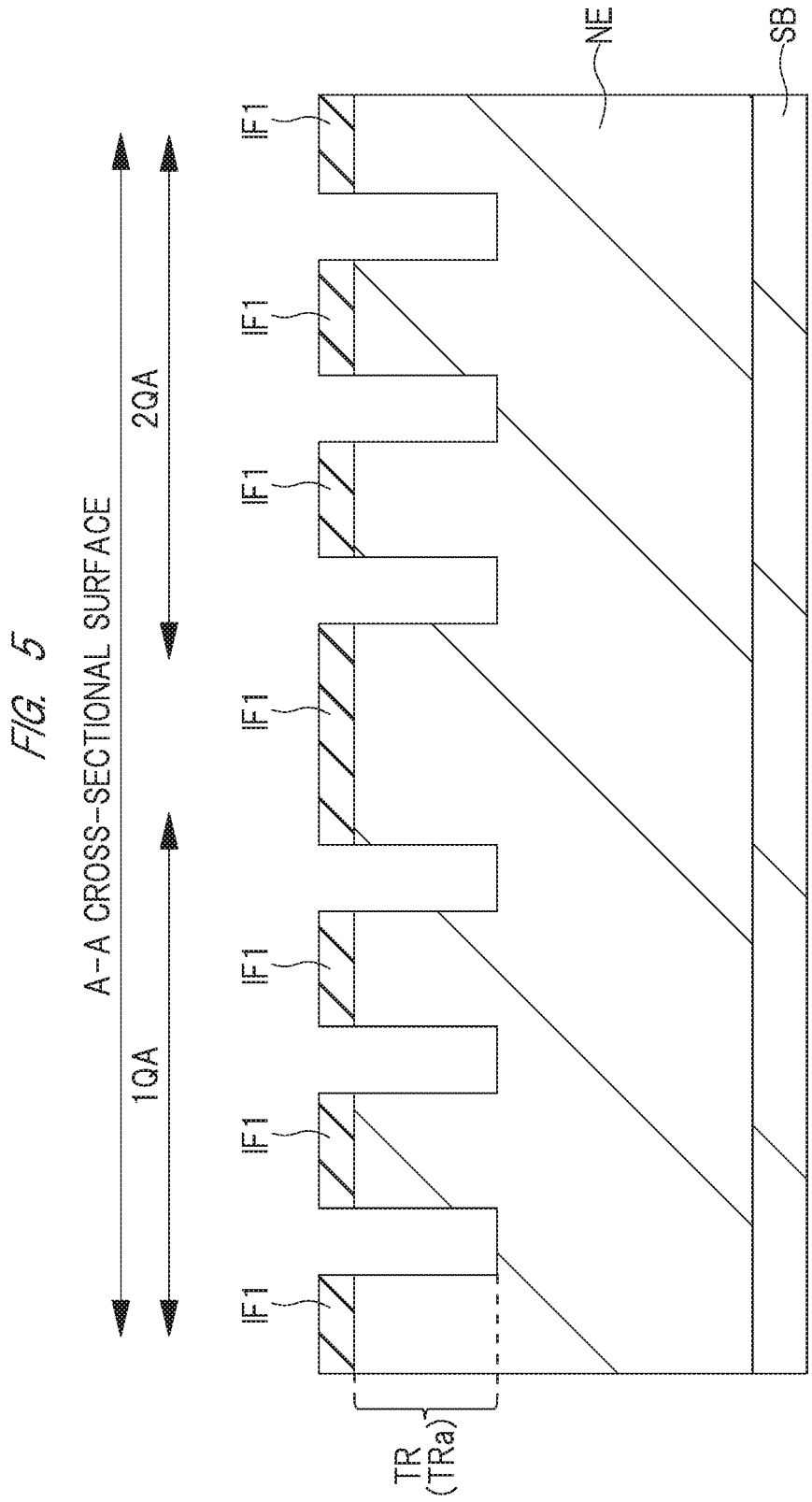
FIG. 5 is a cross-sectional view illustrating a manufacturing process of the semiconductor device according to the first embodiment.

First, as illustrated in FIG. 5, by causing an epitaxial growth while injecting the n-type impurity on the semiconductor substrate SB to which an n-type impurity is injected, the n-type semiconductor layer (epitaxial layer) NE is formed. Here, an impurity concentration of the semiconductor layer NE is larger than that of the semiconductor substrate SB.

Next, on the semiconductor layer NE, by a CVD (chemical vapor deposition) for example, an insulator IF1 formed of silicon nitride is formed. Note that, as another way, the insulator IF1 may be a stacked film of a silicon oxide film and a silicon nitride film formed by forming a silicon oxide film prior to the formation of the silicon nitride film. Next, by a photolithography method or an etching process, the insulator IF1 is patterned. Next, using the patterned insulator IF1 as a mask, by performing a dry etching process, the trench TR is formed to the semiconductor layer NE. Note that, at this stage, only the upper trench part of the trench TR is formed and the lower trench part TRb is not formed.

Figure 6:
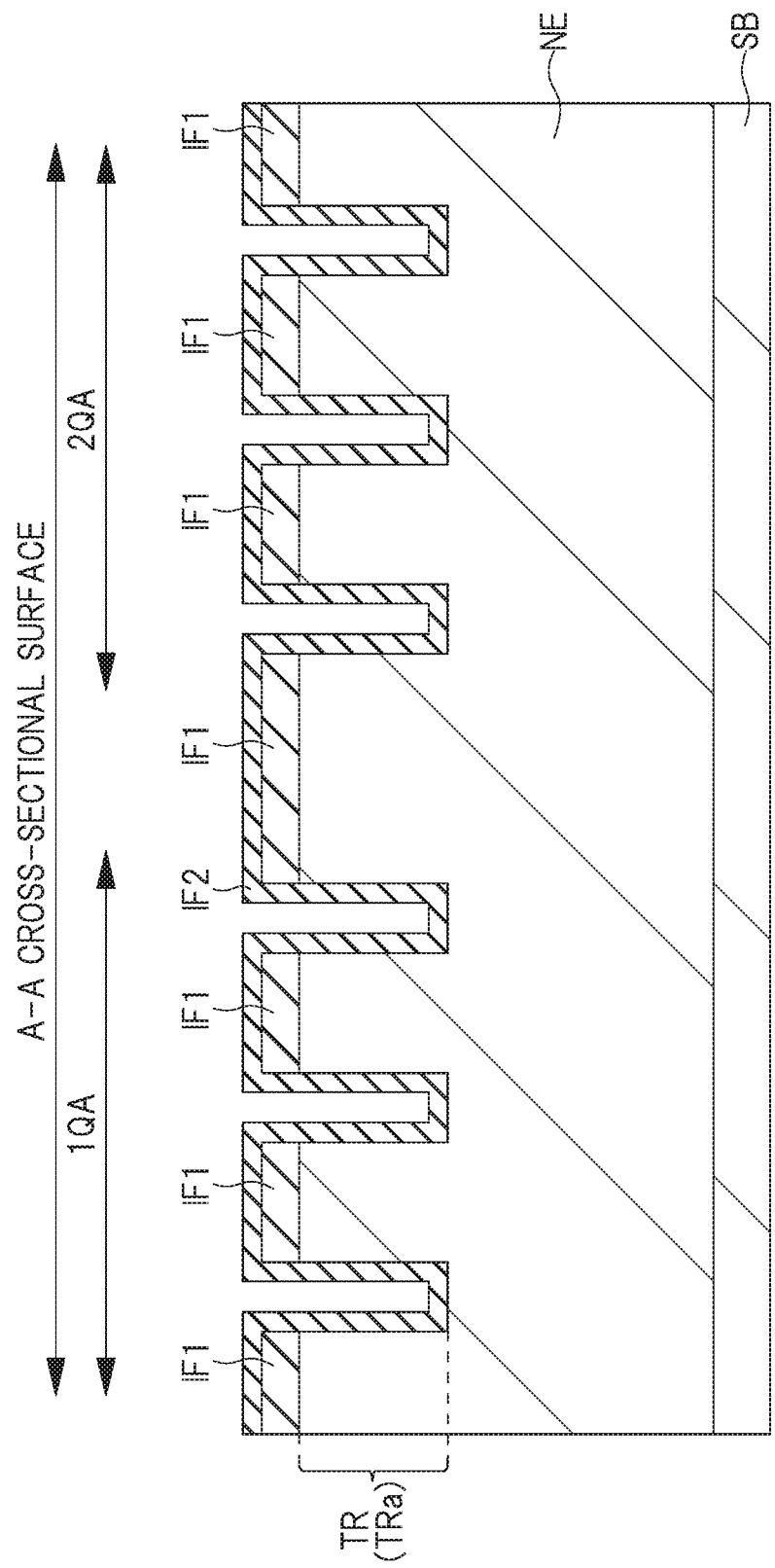
FIG. 6 is a cross-sectional view illustrating the manufacturing process of the semiconductor device continued from FIG. 5.

FIG. 6 illustrates a step of forming the insulator IF2.

The insulator IF2 formed of, for example, silicon nitride is formed on the insulator IF1 by, for example, a CVD method so that a side surface and a bottom surface inside the trench TR (inside the upper trench part TRa) are covered. Here, it is desirable to use the same material to form the insulator IF2 and the insulator IF1.

Figure 7:
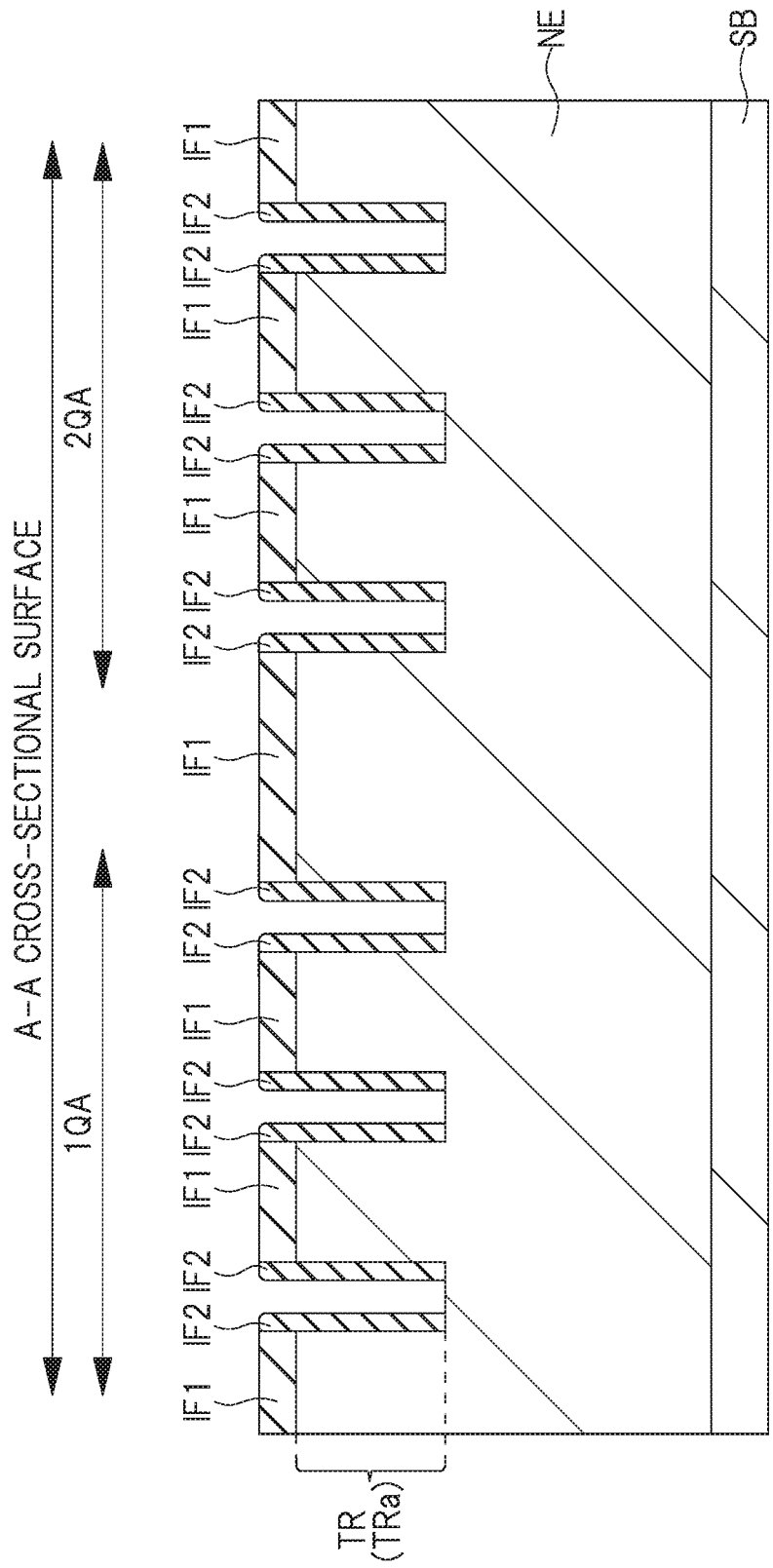
FIG. 7 is a cross-sectional view illustrating the manufacturing process of the semiconductor device continued from FIG. 6.

FIG. 7 illustrates a processing step of the insulator IF2.

By performing an anisotropic etching to the insulator IF2, the insulator IF2 formed on the bottom surface of the upper trench part TRa and on the insulator IF1 is removed. In this manner, the insulator IF2 is left in a side-wall shape on the side surface of the upper trench part TRa.

Figure 8:
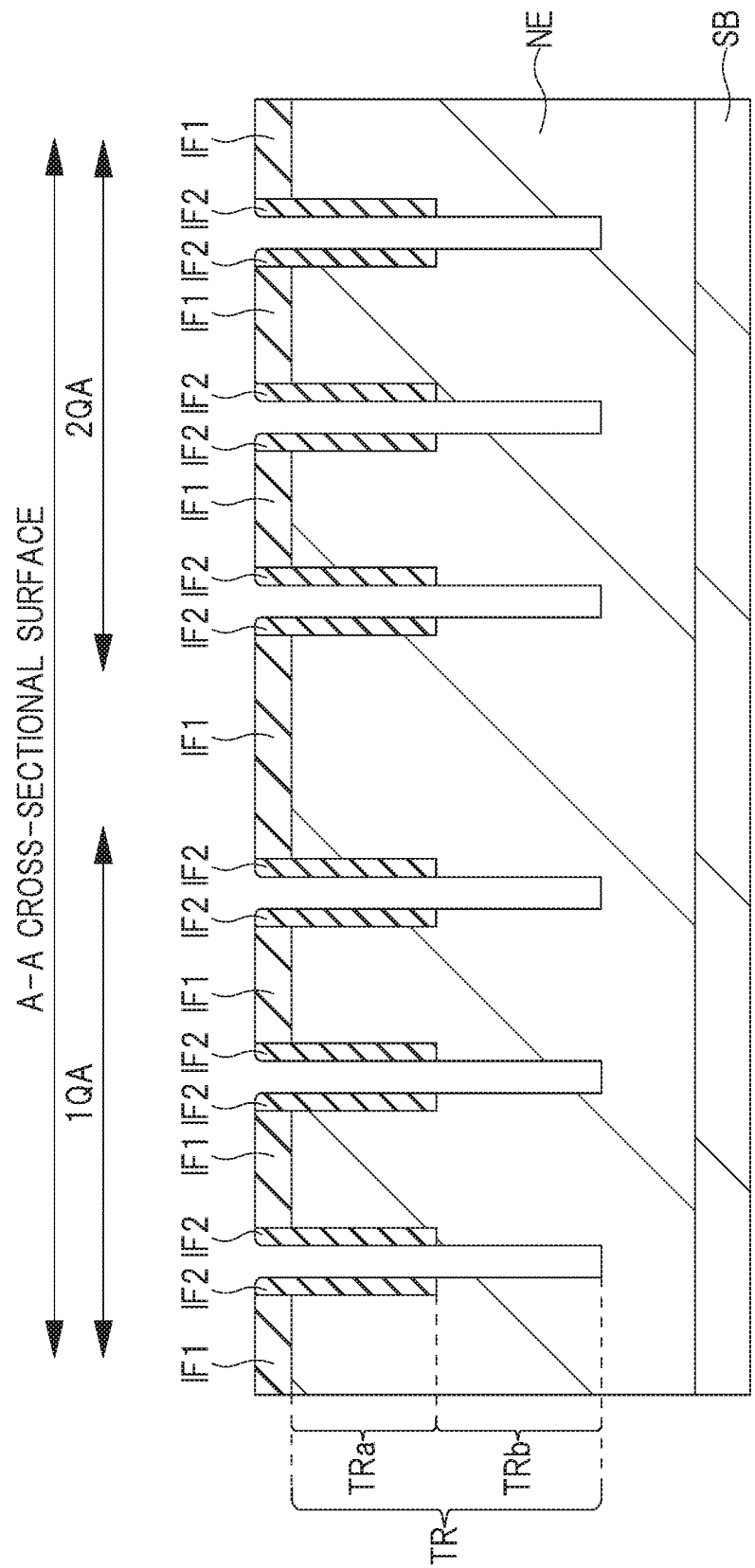
FIG. 8 is a cross-sectional view illustrating the manufacturing process of the semiconductor device continued from FIG. 7.

FIG. 8 illustrates a step of forming the lower trench part TRb.

The lower trench part TRb is formed to the semiconductor layer NE by performing a dry etching process using the insulator IF1 on the semiconductor layer NE and the insulator IF2 of the side surface of the upper trench part TRa as masks. The upper trench part TRa and the lower trench part TRb are continuously formed so that they are united as the trench TR. In FIG. 8, the upper trench part TRa and the lower trench part TRb are illustrated by a dotted line, respectively.

Figure 9:
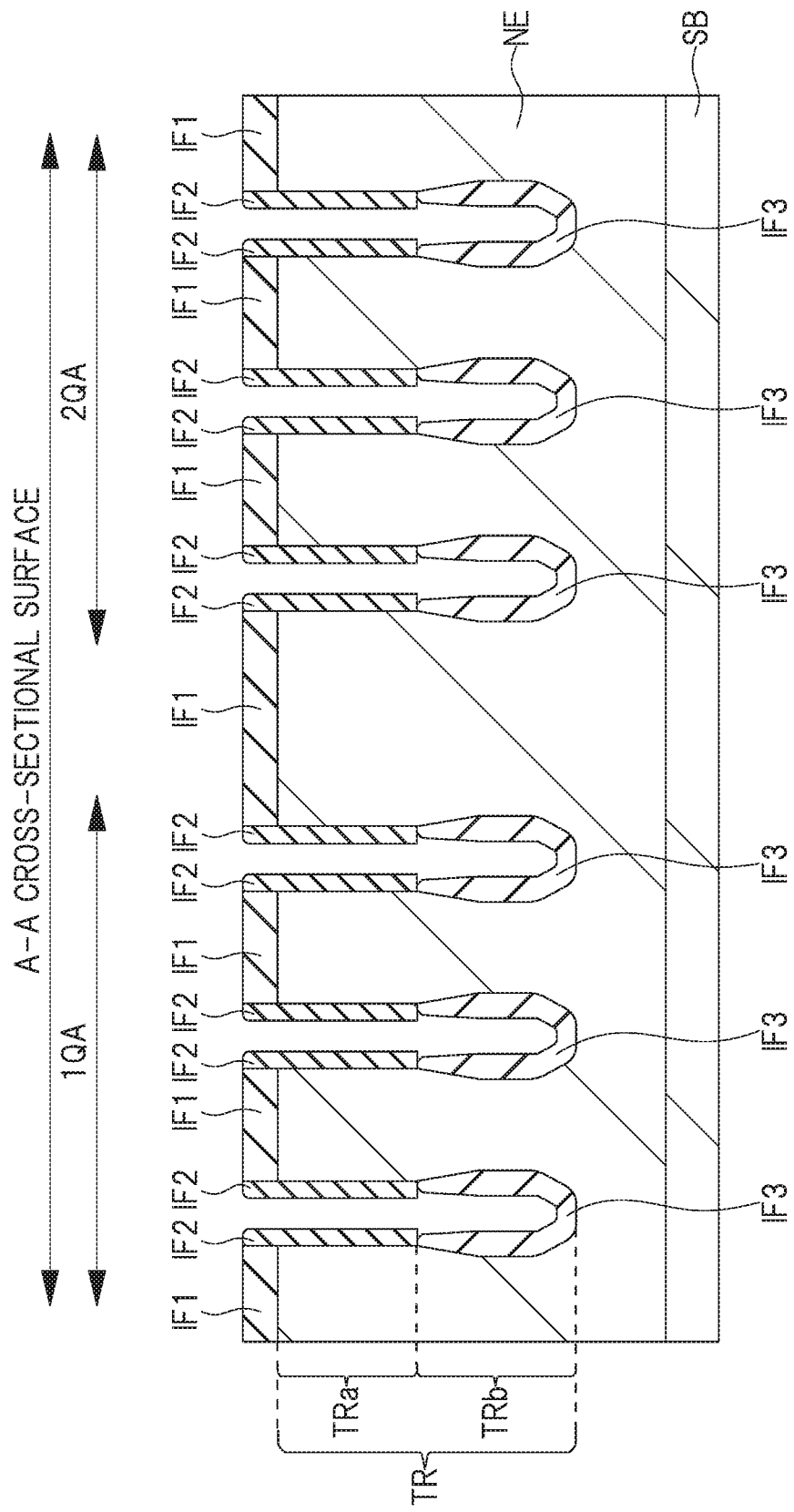
FIG. 9 is a cross-sectional view illustrating the manufacturing process of the semiconductor device continued from FIG. 8.

FIG. 9 illustrates a step of forming an insulator IF3.

Following the step of forming the lower trench part TRb, by performing a thermal process, the semiconductor layer NE being exposed from the insulator IF1 and the insulator IF2 is oxidized, so that the insulator IF3 is formed. That is, on a side surface and a bottom surface of the lower trench part TRb, the insulator IF3 formed of silicon oxide is formed. A thickness of the insulator IF3 is, for example, about 50 to 100 nm.

Figure 10:
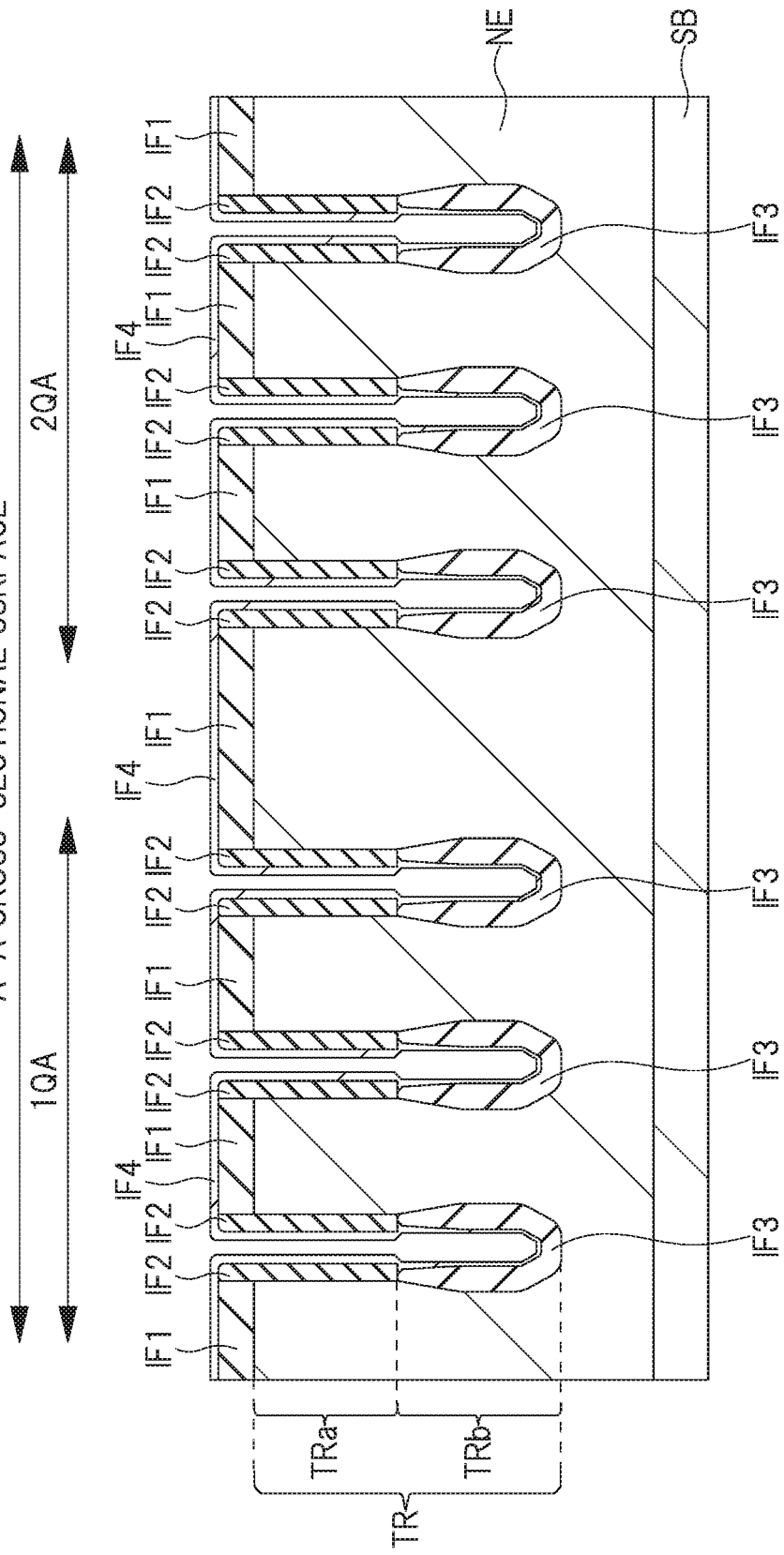
FIG. 10 is a cross-sectional view illustrating the manufacturing process of the semiconductor device continued from FIG. 9.

FIG. 10 illustrates a step of forming an insulator IF4.

The insulator IF4 formed of, for example, silicon oxide is formed on the insulator IF1 by, for example, a CVD method, so that the side surface and the bottom surface of the trench TR. In this manner, each surface of the insulator IF1, the insulator IF2, and the insulator IF3 are covered by the insulator IF4. In addition, a thickness of the insulator IF4 is, for example, about 30 to 50 nm.

Figure 11:
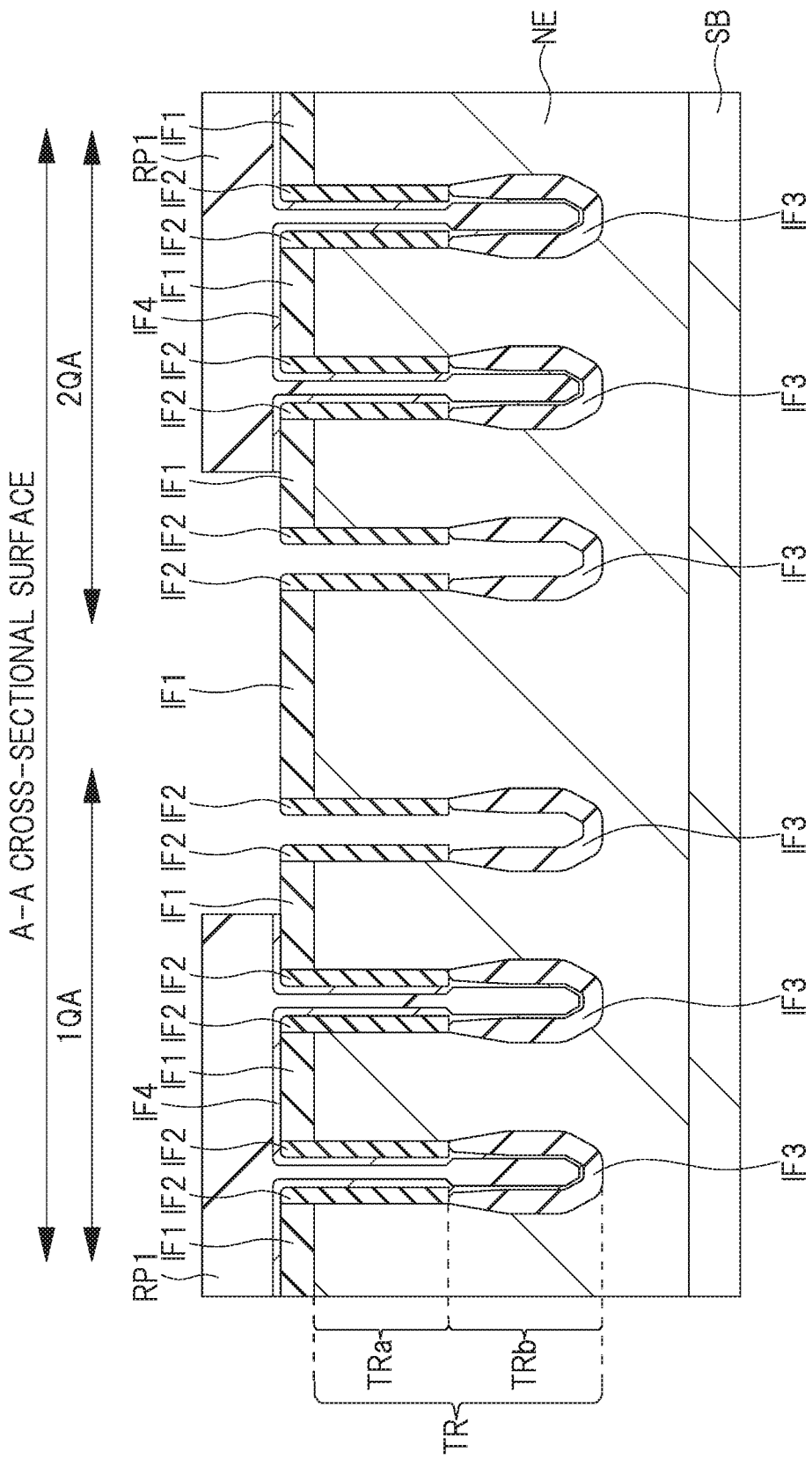
FIG. 11 is a cross-sectional view illustrating the manufacturing process of the semiconductor device continued from FIG. 10.

FIG. 11 illustrates a step of forming a resist pattern RP1 and a step of removing a part of the insulator IF4.

First, the resist pattern RP1 is formed so that a part of the insulator IF4 is covered. The resist pattern RP1 has a pattern to open the trench TR at the outermost position of the MISFET group 1QA and the trench TR at the outermost position of the MISFET group 2QA.

Next, using the resist pattern RP1 as a mask, the insulator IF4 not covered by the insulator IF1 is removed by performing a wet etching process using a solution containing hydrofluoric acid. Next, the resist pattern RP1 is removed by, for example, an asking process.

In addition, upon the step of forming the resist pattern RP1, the resist pattern RP1 is not formed in a region between the trench TR of the MISFET group 1QA and the trench TR of the MISFET group 2QA.

Figure 12:
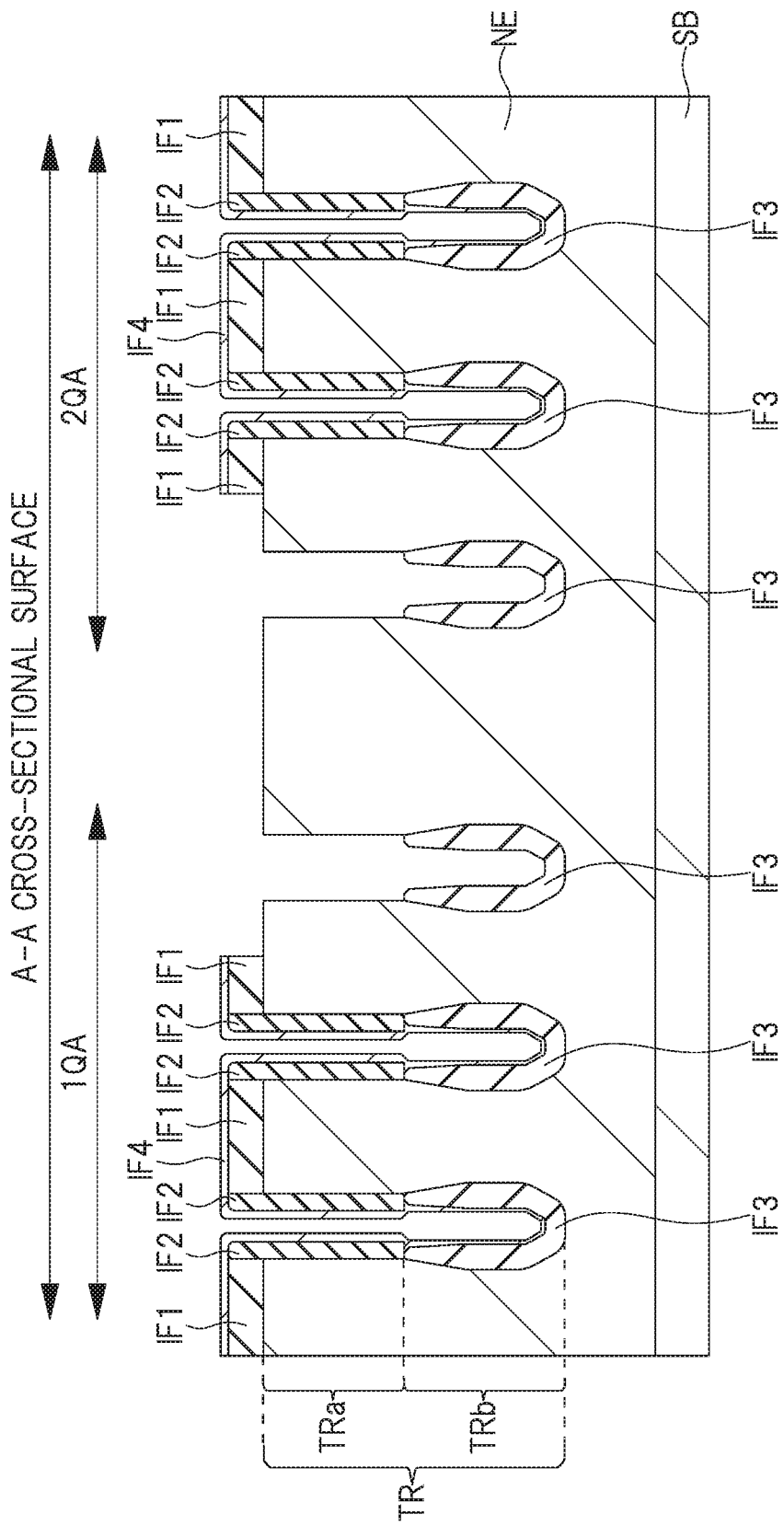
FIG. 12 is a cross-sectional view illustrating the manufacturing process of the semiconductor device continued from FIG. 11.

FIG. 12 illustrates a step of removing the insulator IF1 and the insulator IF2.

For example, by a wet etching process using a solution containing phosphoric acid, the insulator IF1 and the insulator IF2 not covered by the insulator IF 4 are removed. In this manner, the insulator IF2 is selectively removed inside the trench TR at the outermost position of the MISFET group 1QA and inside the trench TR at the outermost position of the MISFET group 2QA. In addition, the insulator IF1 formed on the semiconductor layer NE around them is also selectively removed.

Figure 13:
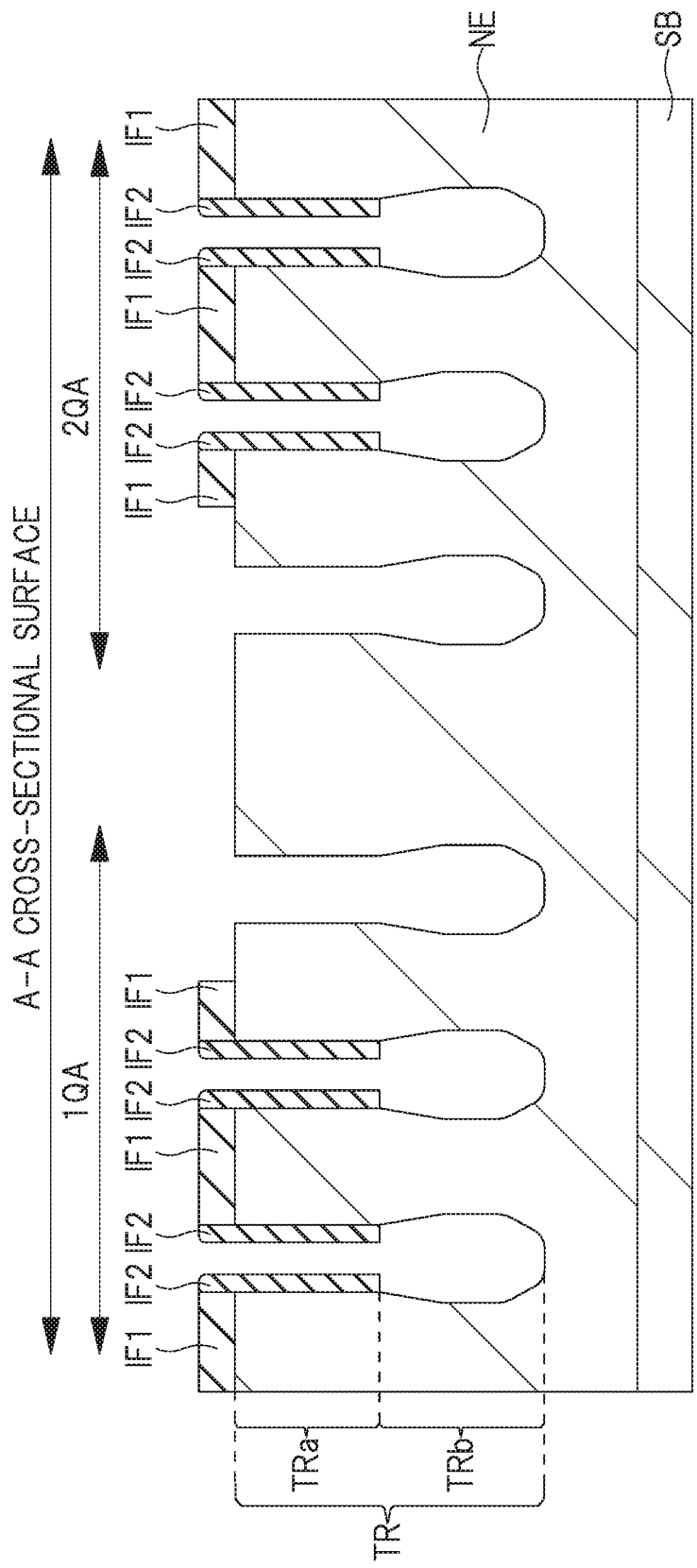
FIG. 13 is a cross-sectional view illustrating the manufacturing process of the semiconductor device continued from FIG. 12.

FIG. 13 illustrates a step of removing the insulator IF3 and the insulator IF4.

For example, by a wet etching process using a solution containing hydrofluoric acid, the insulator IF4 and the insulator IF3 are removed. In this manner, the insulator IF3 formed to all of the lower trench parts TRb of the MISFET group 1QA and the MISFET group 2QA is removed, so that the semiconductor layer NE of the side surface and the bottom surface of the lower trench part TRb is exposed.

Figure 14:
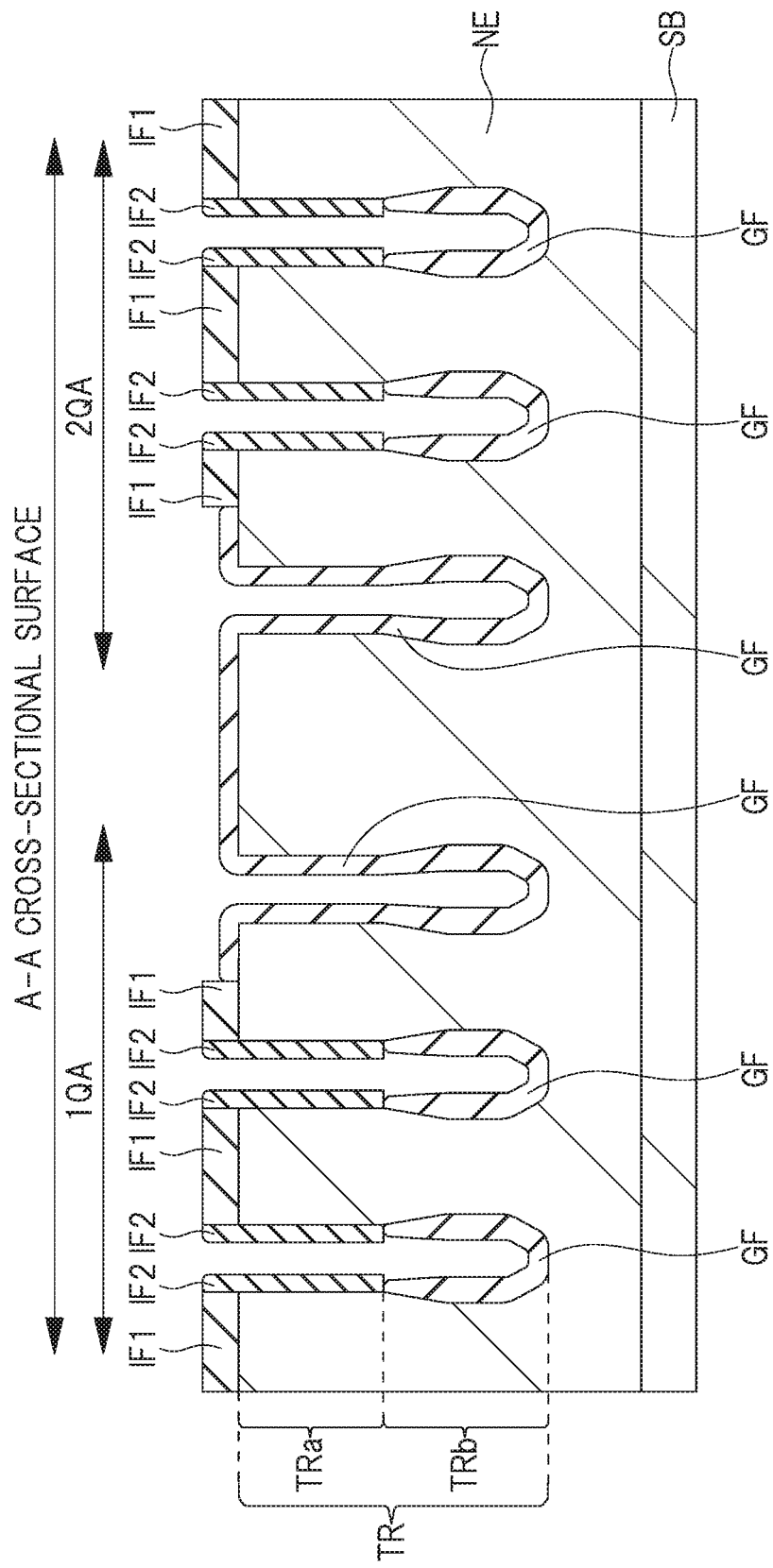
FIG. 14 is a cross-sectional view illustrating the manufacturing process of the semiconductor device continued from FIG. 13.

FIG. 14 illustrates a step of forming the field insulator GF.

In a state in which the semiconductor layer NE of the side surface and the bottom surface of the lower trench part TRb is exposed, a thermal oxidation process is performed so that the field insulator GF is formed on the side surface and the bottom surface of the lower trench part TRb. A thickness of the field insulator GF is, for example, about 100 nm. In the trench TR at the outermost position of the MISFET group 1QA and the trench TR at the outermost position of the MISFET group 2QA, the semiconductor layer NE of each of the upper trench parts TRa is also exposed. Thus, the field insulator GF is formed also on the side surface of the upper trench part TRa and on the semiconductor layer NE outside the trench TR.

Figure 15:
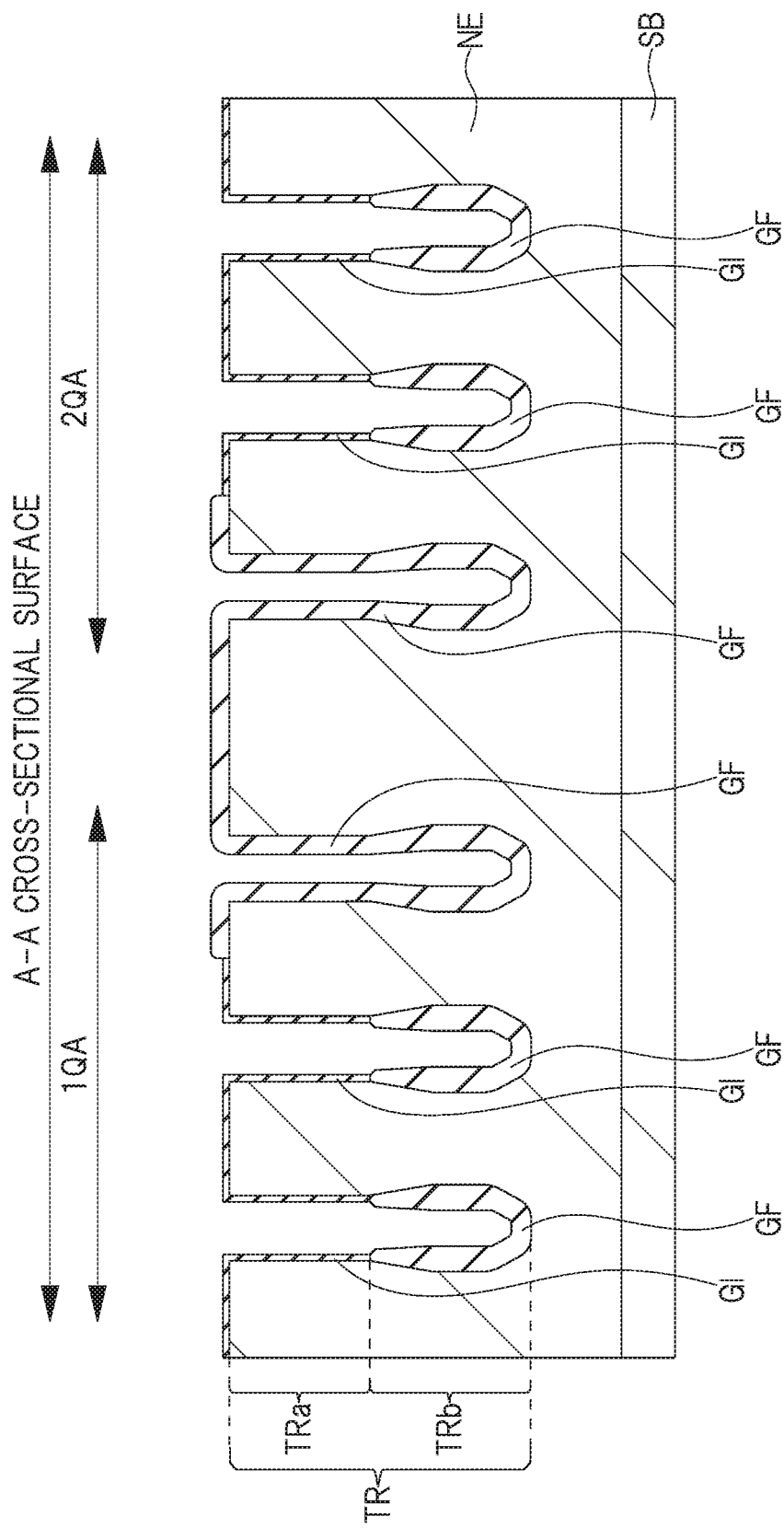
FIG. 15 is a cross-sectional view illustrating the manufacturing process of the semiconductor device continued from FIG. 14.

FIG. 15 illustrates a step of removing the insulator IF1 and the insulator IF2 and also a step of forming the gate insulator GI.

First, by a wet etching process using a solution containing phosphoric acid, the insulator IF1 and the insulator IF2 are removed. In this manner, in the trenches TR except for the trench TR at the outermost position of the MISFET group 1QA and the trench TR at the outermost position of the MISFET group 2QA, the semiconductor layer NE of the upper trench part TRa is exposed.

Next, by a thermal process, on the semiconductor layer NE being exposed, the gate insulator GI is formed. The thickness of the gate insulator GI is, for example, about 20 nm. At this time, since the field insulator GF is also exposed to the thermal process, the thickness of the field insulator GF is also slightly increased.

Figure 16:
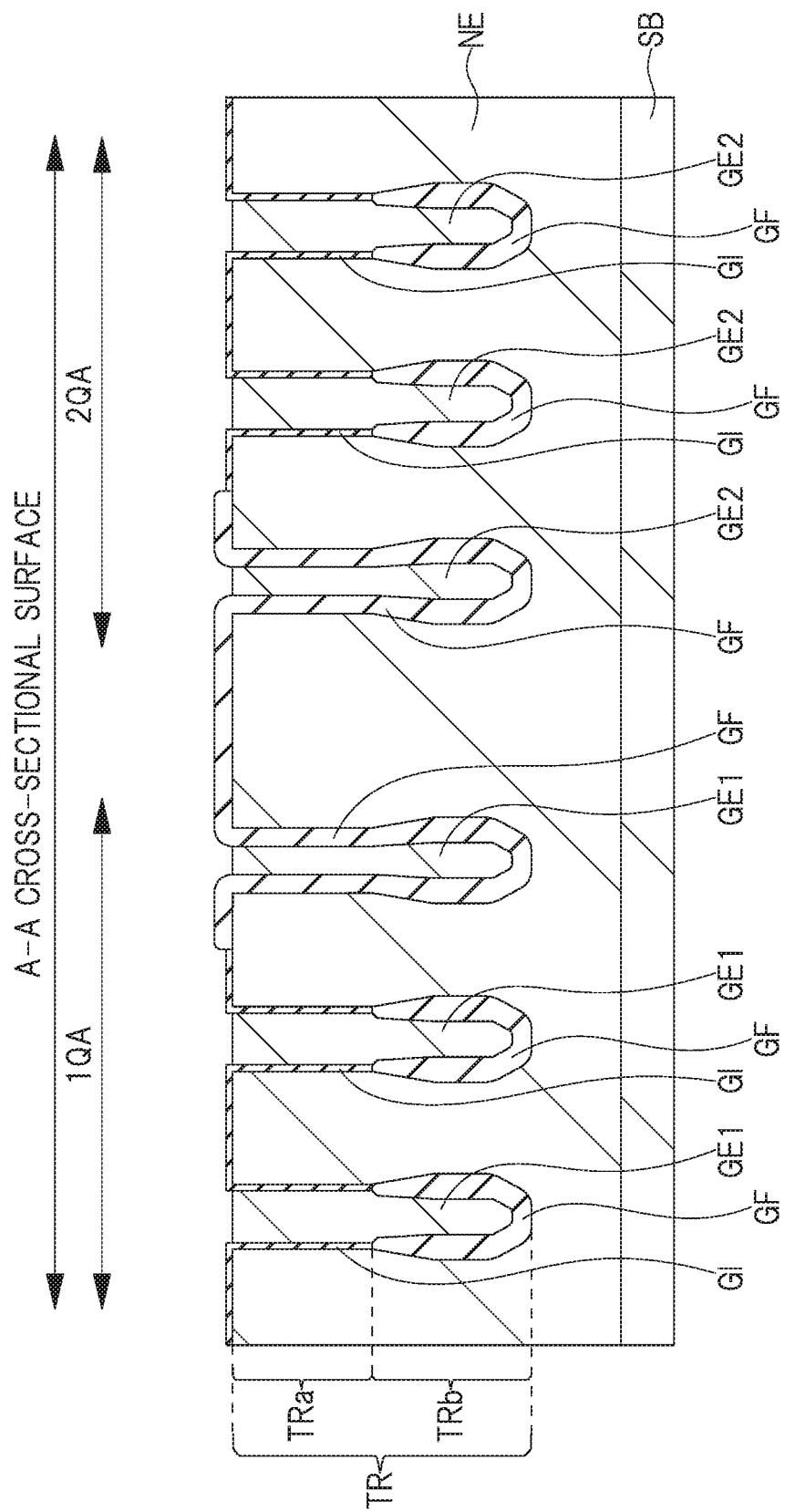
FIG. 16 is a cross-sectional view illustrating the manufacturing process of the semiconductor device continued from FIG. 15.

FIG. 16 illustrates a process of forming the gate electrode GE1 and the gate electrode GE2.

First, a conductive film formed of, for example, a polycrystalline silicon is formed on the field insulator GF and the gate insulator GI outside the trench TR by a CVD method so that the polycrystalline silicon is buried inside the inside the trench TR. Next, by subjecting the conductive film described above to a dry etching process, the conductive film outside the trench TR is removed, so that the conductive film is left inside the trench TR. In this manner, the gate electrode GE1 formed of the conductive film is buried in the trench TR of the MISFET group 1QA and the gate electrode GE2 formed of the conductive film is buried inside the trench TR of the MISFET group 2QA.

Figure 17:
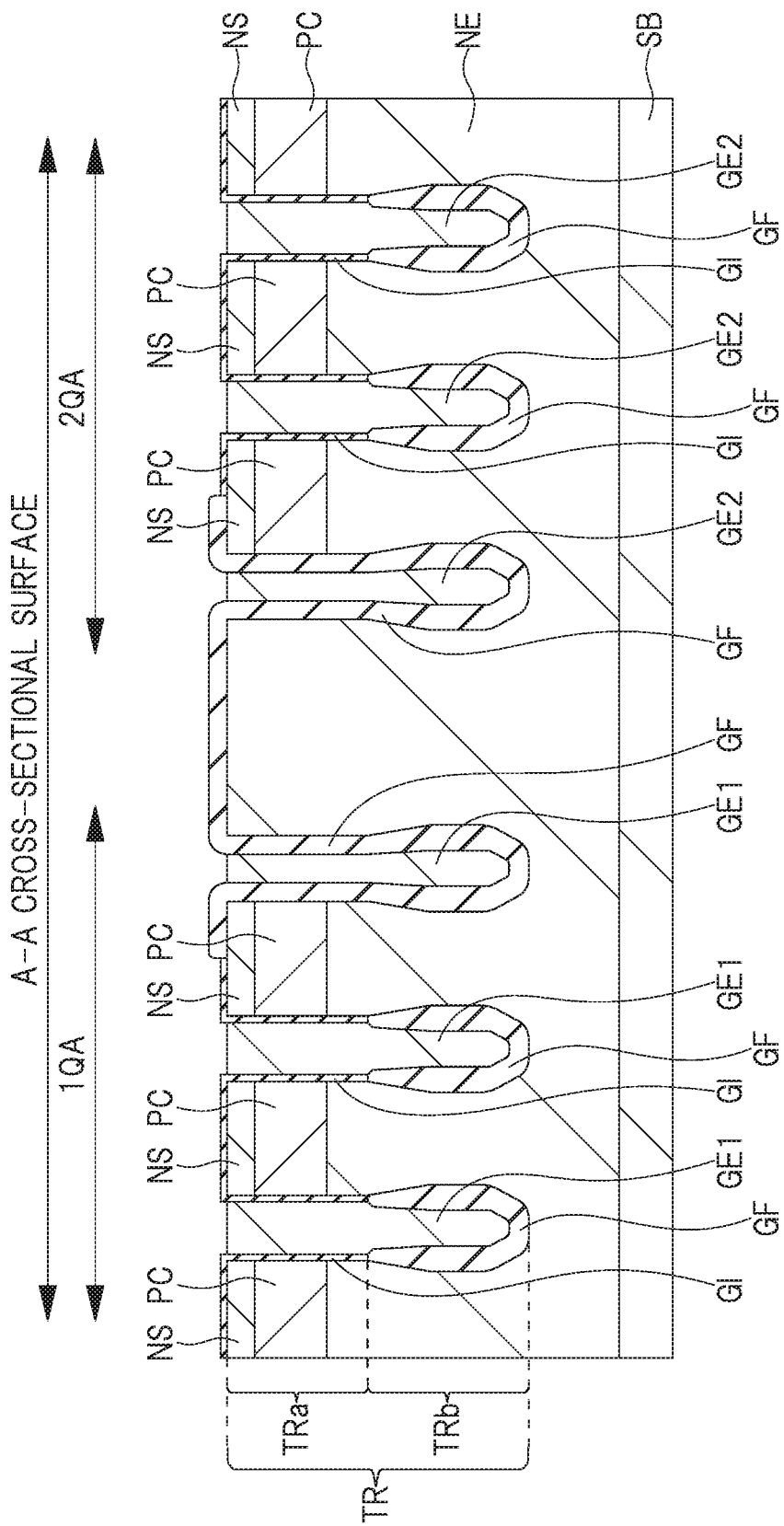
FIG. 17 is a cross-sectional view illustrating the manufacturing process of the semiconductor device continued from FIG. 16.

FIG. 17 illustrates a step of forming the channel region PC and the source region NS.

First, using a photolithography method and an ion injection method, an ion such as boron is selectively injected to a part of the semiconductor layer NE. In this manner, to the part of the semiconductor layer NE, the channel region PC having a p-type conductivity is formed to the part of the semiconductor layer NE. Next, an ion such as arsenic or phosphorus is selectively injected to a part of the semiconductor layer NE. In this manner, to the part of the semiconductor layer NE, the source region NS having an n-type conductivity is formed. Here, ion injection upon forming the source region NS is controlled so that the source region NS is formed inside the channel region PC.

Figure 18:
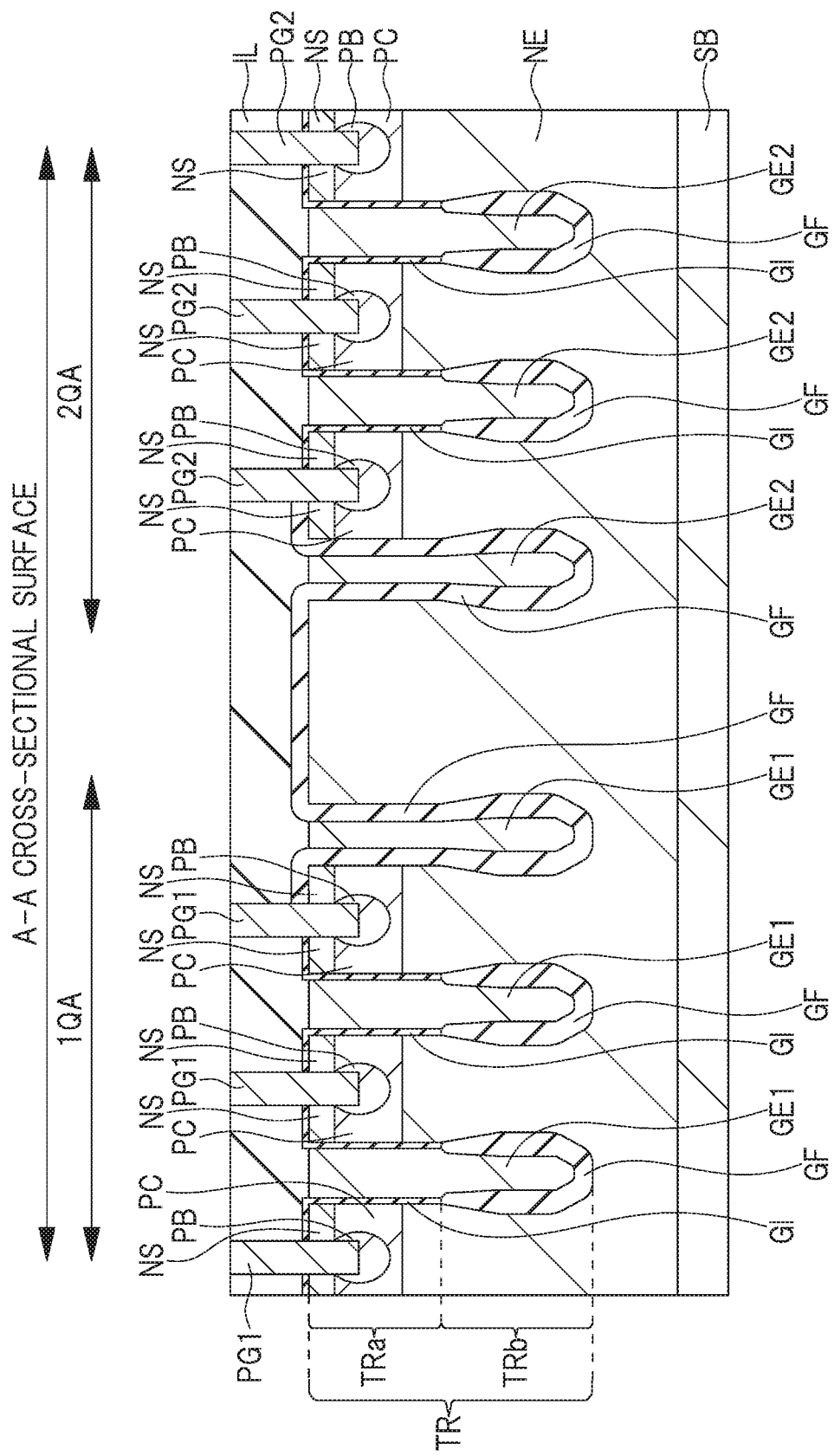
FIG. 18 is a cross-sectional view illustrating the manufacturing process of the semiconductor device continued from FIG. 17.

FIG. 18 illustrates a step of forming the interlayer insulator IL, the body region PB, the plug PG1, and the plug PG2.

First, on each upper surface of the gate electrode GE1, the gate electrode GE2, the gate insulator GI, and the field insulator GF, the interlayer insulator IL formed of, for example, silicon oxide is formed by, for example, a CVD method.

Next, by a photolithography method or a dry etching process, a plurality of contact holes are formed in the interlayer insulator IL. The plurality of contact holes are formed to penetrate the interlayer insulator IL and the source region NS and to each the channel region PC.

Next, by an ion injection method, an ion such as boron is injected to the channel region PC positioned at the bottom portion of the contact hole so that the body region PB is formed inside the channel region PC. The body region PB has a p-type conductivity and has an impurity concentration higher than that of the channel region PC.

Also, although not illustrated in the present embodiment, after the step of forming the contact holes, a silicide layer may be formed to an upper surface of each of a part of the source region NS and the body region PB. In this case, the silicide layer may be formed in the following manner, specifically. First, to an upper surface of each of a part of the source region NS and the body region PB, a metal film for forming a silicide layer formed of, for example, titanium (Ti), cobalt (Co) or nickel (Ni) is formed. Next, by subjecting the metal film into a thermal process, material forming the source region NS and the body region PB and the metal film are reacted, so that a silicide layer formed of such as titanium silicide ($TiSi_2$), cobalt silicide ($CoSi_2$) or nickel silicide (NiSi) is formed. Then, the metal film not yet reacted is removed.

Next, so as to fill the inside of the plurality of contact holes, on the interlayer insulator IL, by a sputtering method for example, a conductive film formed mainly of, for example, tungsten is formed. Next, by performing a polishing process by a CMP (chemical mechanical polishing) for example, the conductive film formed outside the plurality of contact holes is removed. In this manner, the plug PG1 formed of the conductive film described above is buried inside the contact holes of the MISFET group 1QA, and the plug PG2 formed of the conductive film formed of the conductive film is buried inside the contact holes of the MISFET group 2QA.

Note that, although illustration is omitted here, the plug PG3 illustrated in FIG. 3 may be formed in the same step as that of the plug PG1 and the plug PG2 or may be formed in another step.

After the step in FIG. 18, the source wiring S1, the source wiring S2, the protective film OF, and the drain electrode DE are formed, so that the semiconductor device illustrated in FIG. 4 is manufactured. In the following, an example of a manufacturing step of them will be described.

First, on the interlayer insulator IL, by, for example, a CVD method or a sputtering method, a conductive film mainly formed of, for example, aluminum is formed. Next, by a photolithography method and a dry etching process, the conductive film is patterned so that the source wiring S1 and the source wiring S2 are formed. The source wiring S1 is coupled to the plug PG1 and the source wiring S2 is coupled to the plug PG2. Note that, although not illustrated here, by patterning the conductive film described above, the gate wiring G1 and the gate wiring G2 are also formed.

Next, on the source wiring S1 and the source wiring S2, a protection film PF that is a resin film made of polyimide or others or a silicon nitride film is formed by, for example, a coating method or a CVD method.

Next, by subjecting the back surface of the semiconductor substrate SB to a polishing process, the semiconductor substrate SB is thinned to a desired thickness. Next, to the back surface of the semiconductor substrate SB, by a sputtering process or a CVD method, the drain electrode DE formed of a metal film such as a titanium nitride film is formed.

As a main feature of the manufacturing method of the semiconductor device according to the present embodiment, as described with reference to FIG. 11, the resist pattern RP1 is not formed in the region between the trench TR at the outermost position of the MISFET group 1QA and the trench TR at the outermost position of the MISFET group 2QA upon the step of forming the resist pattern RP1. A reason of this feature will be explained in a second studied example described below.

<Description of Second Studied Example>

With reference to FIG. 22, a semiconductor device of the second studied example studied by the inventors of the present invention will be described. FIG. 22 illustrates a step of manufacturing corresponding to FIG. 11 of the present embodiment.

As illustrated in FIG. 22, in the second studied example, a part of the resist pattern RP1 is formed in a region between the trench TR at the outermost position of the MISFET group 1QA and the trench TR at the outermost position of the MISFET group 2QA.

However, when an interval between the trenches TR is desired to be small, since this interval is depending on a width of the resist pattern RP1, it is disadvantageous to form the resist pattern RP1 in this region. That is, it is required to design the interval between two outermost trenches TR to be large considering a design margin such as misalignment, so as not to form the resist pattern RP1 inside the outermost trench TR. Thus, in the second studied example, miniaturization of the semiconductor device is difficult.

<Main Feature of Manufacturing Method of the Semiconductor Device of the Present Embodiment>

In the present embodiment, different from the second studied example, as illustrated in FIG. 11, the resist pattern RP1 is not formed in the region between the two outermost trenches TR. Thus, it is not necessary to consider a design margin of the resist pattern RP1, so that the interval between the two outermost trenches TR can be small. In other words, in the present embodiment, the semiconductor device can be miniaturized.

Particularly, in the present embodiment, as illustrated in FIG. 2, near a central part of the semiconductor chip CHP, the source wiring S1 having a comb-teeth like shape and the source wiring S2 having a comb-teeth like shape are arranged to be meshed with each other. In other words, the MISFET group 1QA formed below the source wiring S1 and the MISFET group 2QA formed below the source wiring S2 are alternately arranged. Therefore, a plurality of the regions between the two outermost trenches TR are provided. Thus, such a device is further advantageous in consideration of miniaturization of a semiconductor device.

Second Embodiment

Figure 19:
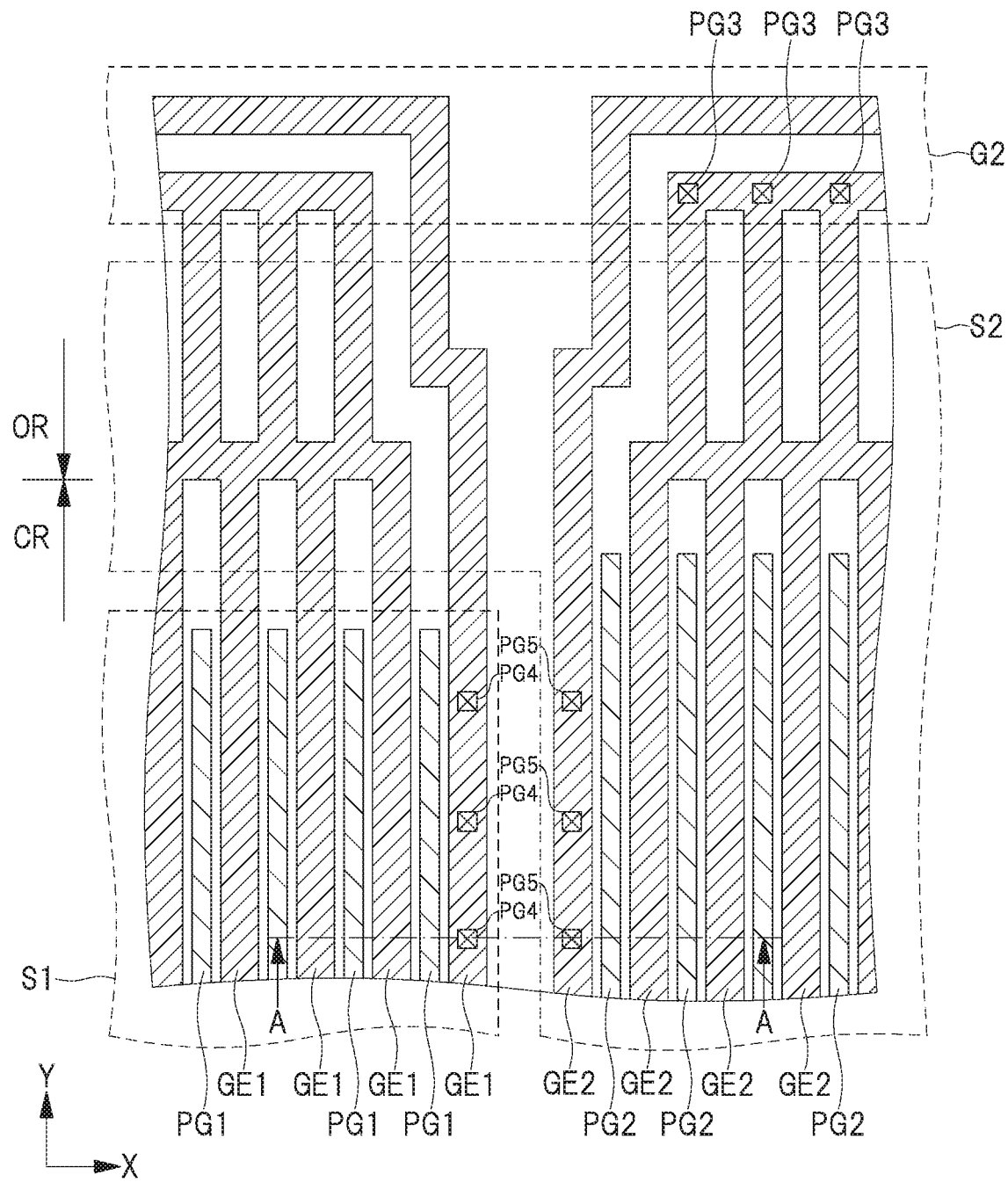
FIG. 19 is a plan view of a main part of a semiconductor device according to a second embodiment.
Figure 20:
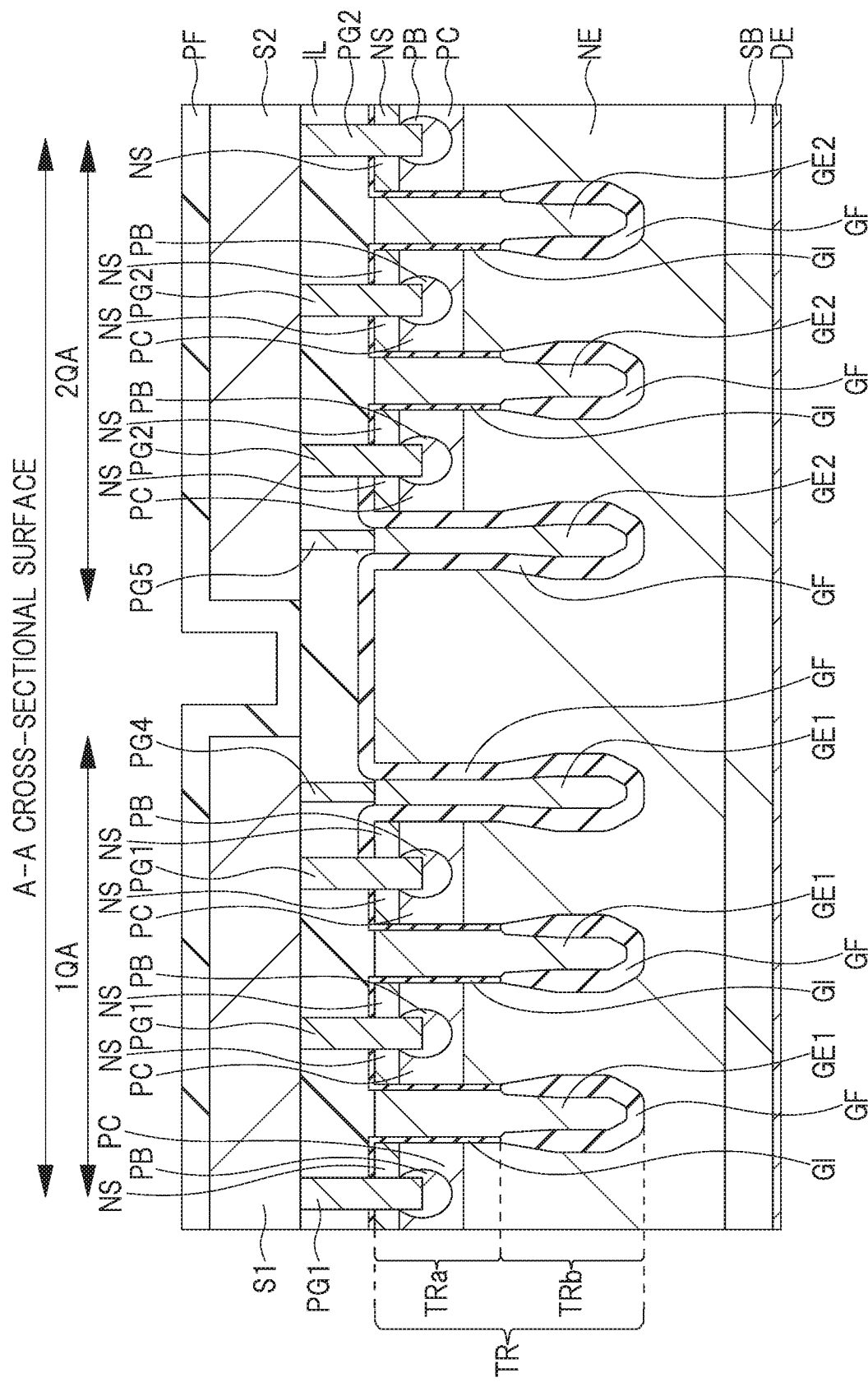
FIG. 20 is a cross-sectional view of the semiconductor device according to the second embodiment.

In the following, a semiconductor device according to a second embodiment will be described with reference to FIGS. 19 and 20. FIG. 19 is a plan view of a main part illustrating the same parts as FIG. 3 of the first embodiment. FIG. 20 is a cross-sectional view taken along a line A-A like in FIG. 19. Note that, in the following description, differences from the first embodiment will be mainly described.

In the first embodiment, the gate electrode GE1 at the outermost position of the MISFET group 1QA is electrically coupled to the gate wiring G1 in the same manner as the other gate electrodes GE1. The gate electrode GE2 at the outermost position of the MISFET group 2QA is electrically coupled to the gate wiring G2 in the same manner as the other gate electrodes GE2.

On the contrary, in the second embodiment, among the plurality of gate electrode GE1, at least a part of the plurality of gate electrodes GE1 is electrically coupled to the gate wiring G1, and, among the plurality of gate electrode GE2, at least a part of the plurality of gate electrodes GE2 is electrically coupled to the gate wiring G2.

In other words, as illustrated in FIGS. 19 and 20, the gate electrode GE1 at the outermost position of the MISFET group 1QA is electrically coupled to the source wiring S1 via a plug PG4, and the other gate electrodes GE1 are electrically coupled to the gate wiring G1. In addition, the gate electrode GE2 at the outermost position of the MISFET group 2QA is electrically coupled to the source wiring S2 via a plug PG5 and the other gate electrodes GE2 are electrically coupled to the gate wiring G2.

Thus, in the second embodiment, the MISFET 1Q at the outermost position of the MISFET group 1QA and the MISFET 2Q at the outermost position of the MISFET group 2QA are dummy transistors not to be operated as transistors. However, in the outermost MISFET 1Q and MISFET 2Q, in the same manner as the first embodiment, the thinner gate insulator GI is not formed but the thicker field insulator GF is formed in the trench TR. Thus, the outermost MISFETs 1Q and 2 have little contribution to the operation of the transistors. In other words, the semiconductor device according to the second embodiment can achieve the same effect as it does not have particular disadvantages as compared to the semiconductor device according to the first embodiment.

In addition, the plug PG4 and the plug PG5 may be formed in the same step as the plug PG1 and the plug PG2 or formed in a different step from them.

In the foregoing, the invention made by the present inventor has been concretely described on the basis of the embodiments. However, it is needless to say that the present invention is not limited to the foregoing embodiments and various modifications and alterations can be made within the scope of the present invention.

The invention claimed is:

1. A semiconductor device having a first region in which a plurality of first MISFETs are formed and a second region in which a plurality of second MISFETs are formed, the semiconductor device comprising:
    a semiconductor layer;
    a plurality of trenches formed in the semiconductor layer in the first region and the second region; and
    a plurality of gate electrodes formed inside the plurality of trenches in the first region and the second region,
    wherein each of the plurality of trenches has an upper trench part and a lower trench part that is positioned lower than the upper trench part,
    wherein, among the plurality of trenches in the first region, a first insulator is formed to the upper trench part and the lower trench part in a first outermost trench that is the closest to the second region,
    wherein, in each of the plurality of trenches in the first region other than the first outermost trench, a second insulator having a thickness smaller than that of the first insulator is formed to the upper trench part and the first insulator is formed to the lower trench part,
    wherein, among the plurality of trenches in the second region, the first insulator is formed to the upper trench part and the lower trench part in the second outermost trench that is the closest to the first region, and
    wherein, in each of the plurality of trenches in the second region other than the second outermost trench, the second insulator is formed to the upper trench part, and the first insulator is formed to the lower trench part.

2. The semiconductor device according to claim 1, wherein each of the plurality of first MISFETs and the plurality of second MISFETs configures a part of a bidirectional switch.

3. The semiconductor device according to claim 2, further comprising:
    a plurality of channel regions formed in the semiconductor layer in the first region and the second region;
    a plurality of source regions formed in the plurality of channel regions in the first region and the second region;
    a first source wiring electrically coupled to the plurality of source regions in the first region;
    a second source wiring electrically coupled to the plurality of source regions in the second region;
    a first gate wiring electrically coupled to at least a part of the plurality of gate electrodes in the first region; and
    a second gate wiring electrically coupled to at least a part of the plurality of gate electrodes in the second region.

4. The semiconductor device according to claim 3,
    wherein each of the semiconductor layer and the plurality of source regions has an n-type conductivity, and
    wherein each of the plurality of channel regions has a p-type conductivity.

5. The semiconductor device according to claim 3,
    wherein, in a plan view, each of the first source wiring and the second source wiring is formed in a comb-teeth like shape,
    in a plan view, comb teeth of the first source wiring and comb teeth of the second source wiring are formed to engage each other,
    the plurality of first MISFETs are formed below the first source wiring, and
    the plurality of second MISFETs are formed below the second source wiring.

6. The semiconductor device according to claim 3,
    wherein the gate electrode formed inside the first outermost trench is electrically coupled to the first source wiring, and
    wherein the gate electrode formed inside the second outermost trench is electrically coupled to the second source wiring.

7. A semiconductor device having a first region in which a plurality of first MISFETs are formed and a second region in which a plurality of second MISFETs are formed, the semiconductor device comprising:
    a semiconductor layer;
    a plurality of trenches formed in the semiconductor layer in the first region and the second region; and
    a plurality of gate electrodes formed inside the plurality of trenches in the first region and the second region,
    wherein each of the plurality of trenches has an upper trench part and a lower trench part that is positioned lower than the upper trench part,
    wherein, among the plurality of trenches in the first region, a first insulator is formed to the upper trench part and the lower trench part in a first outermost trench that is the closest to the second region,
    wherein, in each of the plurality of trenches in the first region other than the first outermost trench, a second insulator having a thickness smaller than that of the first insulator is formed to the upper trench part and the first insulator is formed to the lower trench part, and
    wherein a width of the lower trench part is larger than that of the upper trench part.

* * * * *